(12) United States Patent
Mun et al.

(10) Patent No.: US 8,319,929 B2
(45) Date of Patent: *Nov. 27, 2012

(54) LIQUID CRYSTAL DISPLAY INCLUDING A VARIABLE WIDTH SPACER ELEMENT AND METHOD FOR FABRICATING THE SAME

(75) Inventors: Joong-Hyun Mun, Suwon-si (KR); Jang-Kun Song, Seoul (KR); Yong-Woo Choi, Suwon (KR); Bo-Sung Kim, Seoul (KR); Kwan-Wook Jung, Suwon (KR); Jung-Ho Lee, Suwon (KR); Hyo-Rak Nam, Wonju (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/196,791

(22) Filed: Aug. 2, 2011

(65) Prior Publication Data

US 2011/0285952 A1 Nov. 24, 2011

Related U.S. Application Data

(60) Continuation of application No. 12/912,702, filed on Oct. 26, 2010, now Pat. No. 8,009,257, which is a continuation of application No. 12/144,438, filed on Jun. 23, 2008, now Pat. No. 7,843,542, which is a division of application No. 11/313,965, filed on Dec. 22, 2005, now abandoned, which is a continuation of application No. 09/928,349, filed on Aug. 14, 2001, now Pat. No. 7,057,695.

(30) Foreign Application Priority Data

| Aug. 14, 2000 | (KR) | 10-2000-0047001 |
| Jan. 12, 2001 | (KR) | 10-2001-0001791 |
| Aug. 6, 2001 | (KR) | 10-2001-0047318 |
| Aug. 7, 2001 | (KR) | 10-2001-0047489 |

(51) Int. Cl.
*G02F 1/1339* (2006.01)
*G02F 1/1343* (2006.01)

(52) U.S. Cl. ........ 349/141; 349/139; 349/146; 349/155; 349/157

(58) Field of Classification Search .......... 349/155–157, 349/139–146
See application file for complete search history.

(56) References Cited

U.S. PATENT DOCUMENTS 5,680,187 A 10/1997 Nagayama et al.
(Continued)

FOREIGN PATENT DOCUMENTS

EP 08-84626 A2 6/1998
(Continued)

OTHER PUBLICATIONS

Yoshio Koike, et al. "Super High Quality MVA-TFT Liquid Crystal Displays" *FUJITSU Sci. Tech. J.*, 35, 2, pp. 221-228 (Dec. 1999).

(Continued)

*Primary Examiner* — Huyen Ngo
(74) *Attorney, Agent, or Firm* — Innovation Counsel LLP

(57) ABSTRACT

A liquid crystal display with two insulating substrates. A first insulating substrate has crossing signal lines, a pixel electrode, and a drain electrode electrically connected to the pixel electrode through a contact hole. A spacer is formed on the first signal line of the first insulating substrate, and is wider at a first portion close to the first insulating substrate than at a second portion close to the second insulating substrate, and the drain electrode comprises a first portion and a second portion extending in a different direction with respect to the first portion.

17 Claims, 55 Drawing Sheets

U.S. PATENT DOCUMENTS

| | | | |
|---|---|---|---|
| 5,917,527 A | | 6/1999 | Boyd et al. |
| 5,978,061 A | * | 11/1999 | Miyazaki et al. ............. 349/155 |
| 6,016,181 A | | 1/2000 | Shimada |
| 6,022,646 A | | 2/2000 | Kim et al. |
| 6,067,144 A | | 5/2000 | Murouchi |
| 6,097,467 A | | 8/2000 | Fujimaki et al. |
| 6,137,558 A | * | 10/2000 | Koma et al. .................. 349/143 |
| 6,141,077 A | * | 10/2000 | Hirata et al. ................. 349/143 |
| 6,201,592 B1 | | 3/2001 | Terashita et al. |
| 6,317,187 B1 | | 11/2001 | Nakajima et al. |
| 6,356,335 B1 | | 3/2002 | Kim et al. |
| 6,396,559 B1 | | 5/2002 | Kishimoto et al. |
| 6,433,852 B1 | | 8/2002 | Sonoda et al. |
| 6,493,050 B1 | | 12/2002 | Lien et al. |
| 6,501,529 B1 | | 12/2002 | Kurihara et al. |
| 6,538,713 B1 | | 3/2003 | Yanagawa et al. |
| 6,567,144 B1 | | 5/2003 | Kim et al. |
| 6,583,846 B1 | | 6/2003 | Yanagawa et al. |
| 6,614,492 B1 | | 9/2003 | Song |
| 6,657,695 B1 | | 12/2003 | Song et al. |
| 6,671,025 B1 | | 12/2003 | Ikeda et al. |
| 6,678,031 B2 | | 1/2004 | Song |
| 6,724,452 B1 | | 4/2004 | Takeda et al. |
| 6,774,974 B1 | | 8/2004 | Matsuyama |
| 6,836,308 B2 | | 12/2004 | Sawasaki et al. |
| 6,842,211 B2 | | 1/2005 | Katasura |
| 6,888,602 B2 | | 5/2005 | Takeda et al. |
| 6,900,870 B2 | | 5/2005 | Song |
| 6,922,183 B2 | | 7/2005 | Ting et al. |
| 7,133,098 B2 | | 11/2006 | Lin |
| 7,136,140 B1 | * | 11/2006 | Inoue et al. .................. 349/191 |
| 7,714,975 B1 | | 5/2010 | Yamazaki et al. |
| 7,843,542 B2 | * | 11/2010 | Mun et al. .................... 349/141 |
| 8,009,257 B2 | * | 8/2011 | Mun et al. .................... 349/141 |
| 2001/0001567 A1 | | 5/2001 | Lyu et al. |
| 2001/0026347 A1 | | 10/2001 | Sawasaki et al. |
| 2002/0140893 A1 | | 10/2002 | Yi et al. |
| 2003/0081163 A1 | * | 5/2003 | Suzuki et al. ................. 349/139 |
| 2004/0201811 A1 | | 10/2004 | Jun |
| 2005/0140914 A1 | | 6/2005 | Sawasaki et al. |
| 2006/0023151 A1 | | 2/2006 | Lee et al. |
| 2006/0158576 A1 | | 7/2006 | Kim et al. |
| 2007/0200995 A1 | | 8/2007 | Jang |
| 2008/0316405 A1 | | 12/2008 | Jung et al. |
| 2009/0021660 A1 | | 1/2009 | Lu et al. |
| 2009/0027578 A1 | | 1/2009 | You et al. |

FOREIGN PATENT DOCUMENTS

| | | |
|---|---|---|
| JP | 10-268321 | 10/1998 |
| JP | 11-24225 | 9/1999 |
| JP | 11-352489 | 12/1999 |
| JP | 11-352491 | 12/1999 |
| JP | 2000-122080 | 4/2000 |
| JP | 2000-193975 | 7/2000 |
| JP | 3171174 B | 3/2001 |
| JP | 2001-201750 | 7/2001 |
| JP | 3255107 B | 11/2001 |
| JP | 3558533 B | 5/2004 |
| JP | 2000-131701 | 5/2005 |
| KR | 2000-0057740 A | 9/2000 |
| KR | 2001-0050691 A | 6/2001 |

OTHER PUBLICATIONS

Y. Tanaka, et al. "A New Design to Improve Performance and Simplify the Manufacturing Process of High-Quality MVA TFT-LCD Panels" 16.5L Late-news Paper—*SID99 Digest* p. 206 (1999).

Y. Taniguchi, et al. "An Ultra-High-Quality MVA-LCD Using a New Multi-Layer CF Resin Spacer and Black-Matrix" 25.3—*SID00 Digest* pp. 378-381(2000).

* cited by examiner

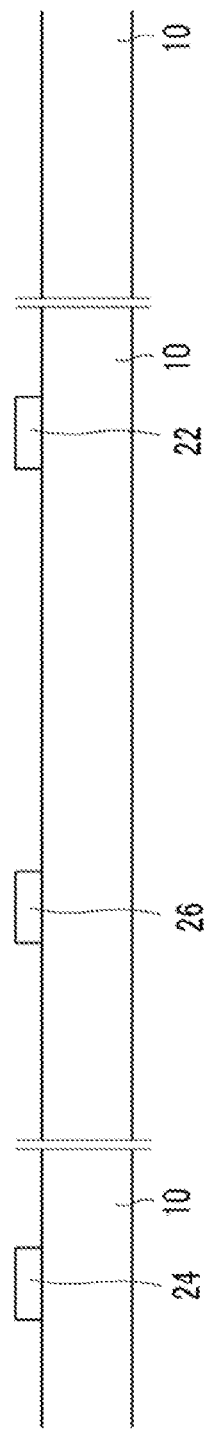

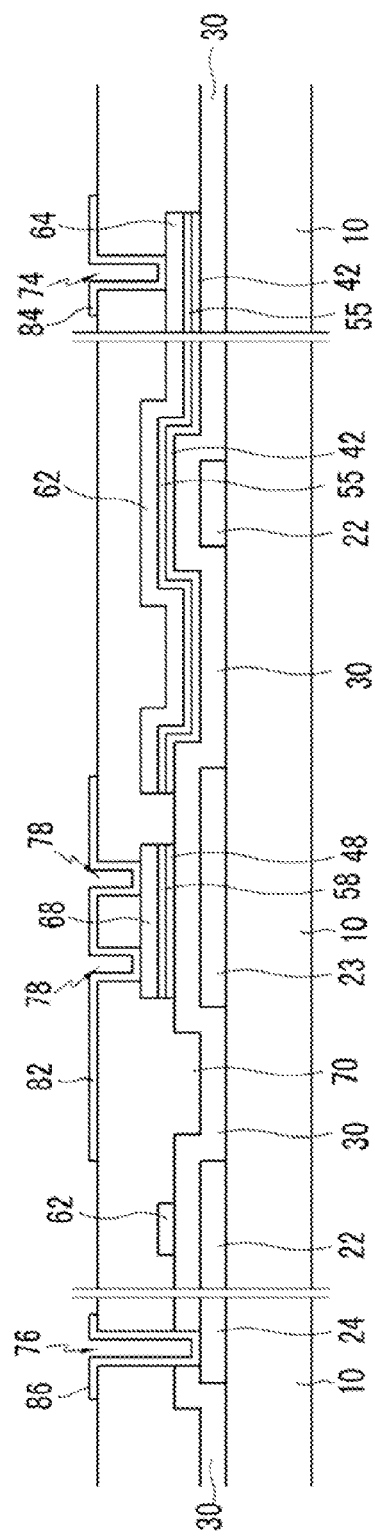
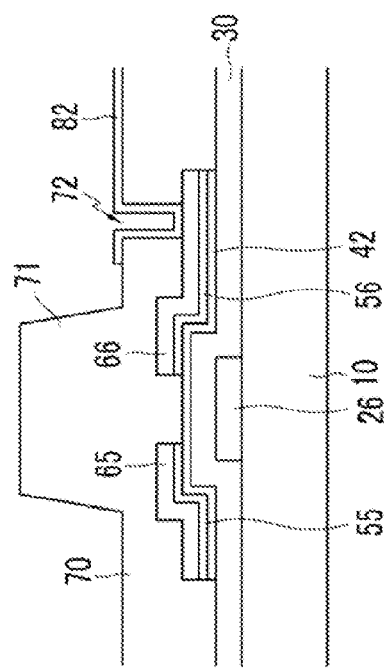
FIG.37
FIG.38

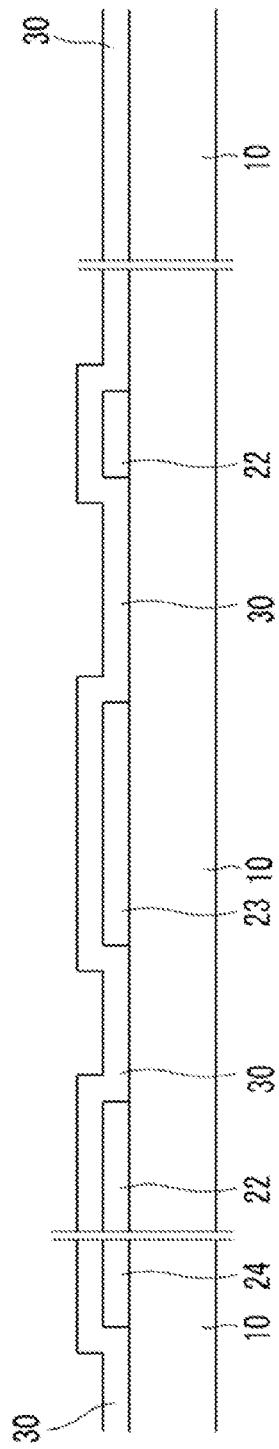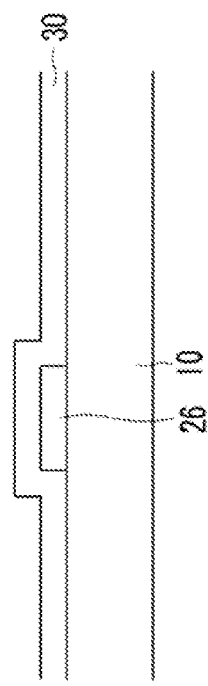

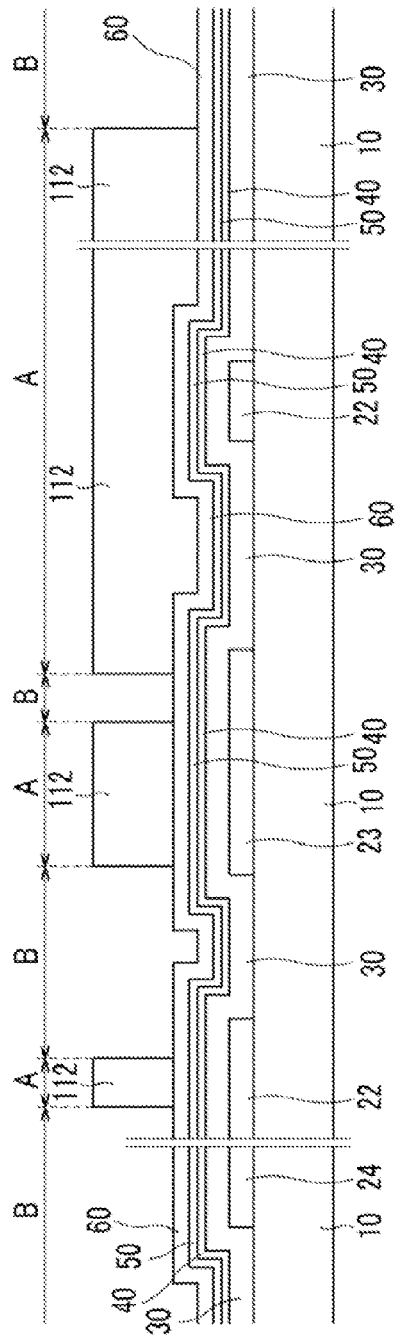
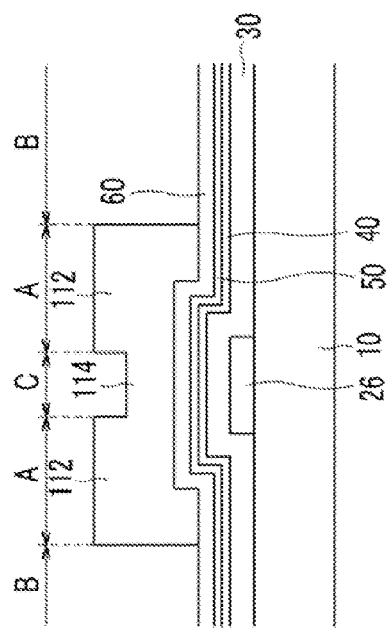
FIG.42A
FIG.42B

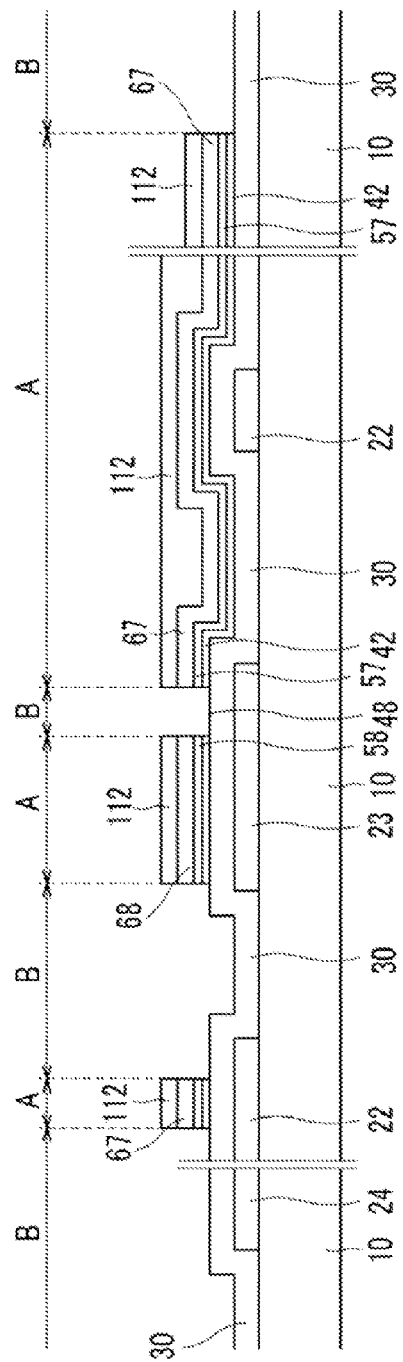
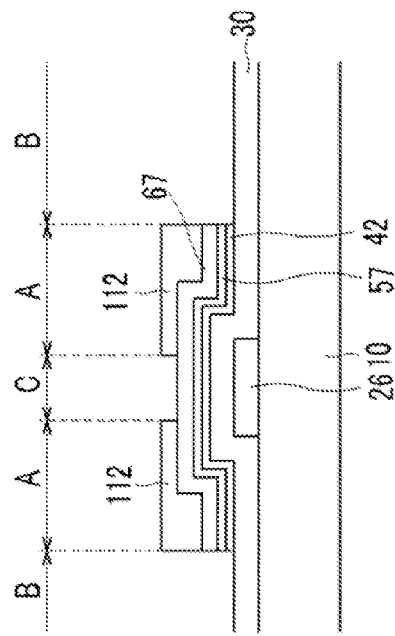
FIG.44A
FIG.44B

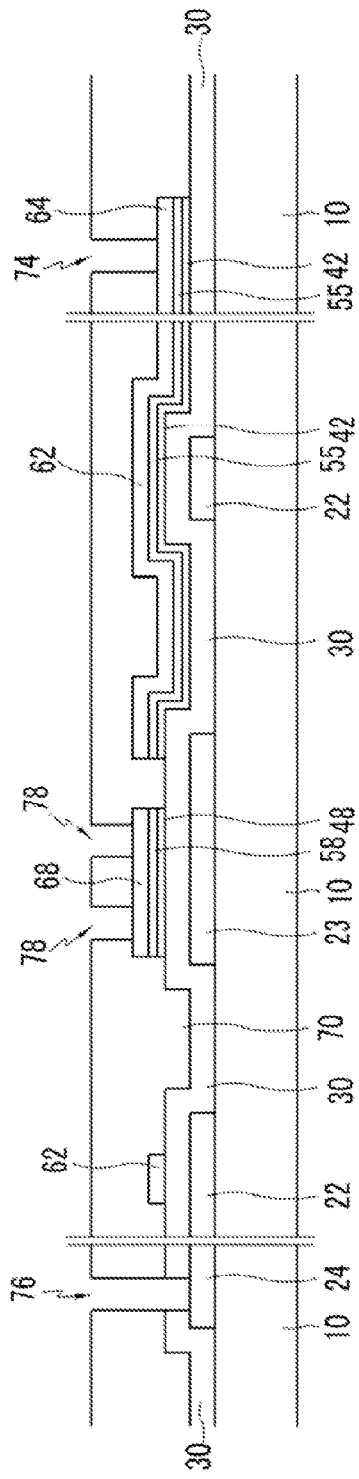

LIQUID CRYSTAL DISPLAY INCLUDING A VARIABLE WIDTH SPACER ELEMENT AND METHOD FOR FABRICATING THE SAME

CROSS-REFERENCE TO RELATED APPLICATIONS

This application is a Continuation of U.S. patent application Ser. No. 12/912,702 filed on Oct. 26, 2010 which is a Continuation of U.S. patent application Ser. No. 12/144,438 filed on Jun. 23, 2008, which is a Divisional of U.S. patent application Ser. No. 11/313,965 filed on Dec. 22, 2005, which is a Continuation of U.S. patent application Ser. No. 09/928,349 filed on Aug. 14, 2001 which issued as U.S. Pat. No. 7,057,695, which claims priority to and the benefit of Korean Patent Application Nos. 10-2001-47489 filed on Aug. 7, 2001; 10-2001-0047318 filed on Aug. 6, 2001; 10-2001-001791 filed on Jan. 12, 2001; 10-2000-0047001 filed on Aug. 14, 2000, the disclosures of which are incorporated herein by reference in their entirety.

BACKGROUND OF THE INVENTION (a) Field of the Invention

The present invention relates to a liquid crystal display and a method for fabricating the same and, more particularly, to a liquid crystal display that has spacers for maintaining the gap between two substrates.

(b) Description of the Related Art

Generally, a liquid crystal display has a structure where a liquid crystal bearing dielectric anisotropy is sandwiched between a color filter substrate and a thin film transistor array substrate. The color filter substrate has a common electrode, a color filter and a black matrix, and the thin film transistor array substrate has a thin film transistor and a pixel electrode. An electric field is applied to the liquid crystal, thereby controlling the light transmission and displaying the desired picture image.

In order to obtain a wide viewing angle, such a liquid crystal display uses a mode of patterned vertical alignment (PVA) having multiple domains. In the PVA mode, opening patterns or protrusions are made at the pixel electrode and the common electrode while forming fringe fields there. These fringe fields make the liquid crystal molecules to be inclined in various directions, thereby realizing wide viewing angle.

Meanwhile, in order to maintain the gap between the two substrates in a constant manner, elastic spacers are disposed between them. However, when an external impact is applied to the liquid crystal display, the gap between the substrates is seriously deformed due to the elasticity of the spacers, causing spots on the screen.

Furthermore, a separate process should be made to form such spacers, and this deteriorates the production efficiency.

SUMMARY OF THE INVENTION

It is an object of the present invention to provide a liquid crystal display that minimizes variation in the brightness while enhancing the picture quality.

It is another object of the present invention to provide a method for fabricating a liquid crystal display in simplified processing steps.\

These and other objects may be achieved by a liquid crystal display with the following features.

According to one aspect of the present invention, the liquid crystal display includes first and second substrates. The first substrate has a first insulating substrate, and a pixel electrode formed on the first insulating substrate with a first opening pattern. The pixel electrode has upper and lower half regions, upper and lower sides, and left and right sides. The second substrate has a second insulating substrate, and a common electrode formed on the second insulating substrate with a second opening pattern. The first and the second opening patterns proceed parallel to each other while being arranged in an alternate manner. A liquid crystal material is injected between the first and the second substrates. A spacer is positioned at an end of the second opening pattern to maintain the distance between the first and the second substrates.

The first opening pattern has a first opening portion positioned at the upper half region of the pixel electrode while proceeding in a first direction, and a second opening portion positioned at the lower half region of the pixel electrode while proceeding in a second direction. The first and the second directions are perpendicular to each other. The second opening pattern has a first trunk opening portion positioned at a region of the common electrode corresponding to the upper half region of the pixel electrode while proceeding in the first direction, and a second trunk opening portion positioned at another region of the common electrode corresponding to the lower half region of the pixel electrode while proceeding in the second direction.

The first direction proceeds in a slant manner with respect to the sides of the pixel electrode.

The second opening pattern further has a first branch opening portion overlapping the upper and lower sides of the pixel electrode, and a second branch opening portion overlapping the left and right sides of the pixel electrode. The first opening pattern further has a third opening portion positioned between the upper and the lower half regions of the pixel electrode while proceeding parallel to the upper and lower sides of the pixel electrode. The first and the second opening patterns divide the pixel electrode into a plurality of closed polygons.

The second branch opening portion has an opening width larger than the first trunk opening portion. The first direction proceeds parallel to one of the sides of the pixel electrode.

According to another aspect of the present invention, the liquid crystal display includes first and second substrates. The first substrate has a first insulating substrate, and a pixel electrode formed on the first insulating substrate with a first opening pattern. The pixel electrode has a first side and a second side facing the first side. The first opening pattern has a first opening portion proceeding from the first side of the pixel electrode in the horizontal direction, and second and third opening portions proceeding from the first side of the pixel electrode to the second side in a slant manner symmetrical to each other with respect to the first opening portion while being gradually reduced in distance from each other. The second substrate has a second insulating substrate facing the first insulating substrate, and a common electrode formed on the second insulating substrate with a second opening pattern. The first and the second opening patterns are arranged in an alternate manner. The second opening pattern has fourth to sixth opening portions. The fourth opening portion has a trunk proceeding in the horizontal direction, first and second branches proceeding from the trunk in a slant manner while being gradually increased in distance from each other, and first and second sub-branches extended from the first and the second branches in the vertical direction while proceeding opposite to each other. The fifth opening portion has a first base proceeding parallel to the first branch, and first and second limbs extended from both ends of the first base in the horizontal direction and in the vertical direction. The sixth opening portion proceeds symmetrical to the fifth opening portion with respect to the fourth opening portion. A liquid crystal material is injected between the first and the second substrates. A spacer is positioned at an end of the second opening pattern to maintain the distance between the first and the second substrates.

According to still another aspect of the present invention, the liquid crystal display has first and second substrates. The first substrate has a first insulating substrate, and a pixel electrode formed on the first insulating substrate with a first opening pattern. The pixel electrode has upper and lower half regions. The first opening pattern has a first opening portion vertically partitioning the upper half region of the pixel electrode, and a second opening portion horizontally partitioning the lower half region of the pixel electrode. The second substrate has a second insulating substrate facing the first insulating substrate, and a common electrode formed on the second insulating substrate with a second opening pattern. The second opening pattern has a third opening portion proceeding in the vertical direction, and a fourth opening portion proceeding in the horizontal direction below the third opening portion. The first and the third opening portions are arranged in an alternate manner while vertically partitioning the upper half region of the pixel electrode into a plurality of micro-regions. The second and the fourth opening portions are arranged in an alternate manner while horizontally partitioning the lower half region of the pixel electrode into a plurality of micro-regions. A liquid crystal material is injected between the first and the second substrates. A spacer is provided between the two substrate to maintain the distance between them.

According to still another aspect of the present invention, a color filter substrate for the liquid crystal display includes an insulating substrate, a black matrix formed on the insulating substrate, a color filter formed at the black matrix, a common electrode formed on the entire surface of the common electrode, and first and second protrusions formed on the common electrode. The first protrusion has a first thickness, and the second protrusion has a second thickness greater than the first thickness.

The first and the second protrusions are formed with one or more of a photosensitive organic insulating layer, a photoresist film, and a silicon-based insulating layer. The common electrode is formed with indium tin oxide or indium zinc oxide.

According to still another aspect of the present invention, in a method for fabricating a color filter substrate for the liquid crystal display, a black matrix is first formed on an insulating substrate. A color filter is then formed on the black matrix. A common electrode is formed on an entire surface of the insulating substrate. An insulating layer is deposited onto the common electrode. The insulating layer is then patterned to thereby form a first protrusion with a first thickness, and a second protrusion with a second thickness greater than the first thickness.

The insulating layer is formed with one or more of a photosensitive organic insulating layer, a photoresist film, and a silicon-based insulating layer. The common electrode is formed with indium tin oxide or indium zinc oxide.

The insulating layer may be formed with a negative photosensitive organic insulating material. In this case, the first and the second protrusions are formed through a mask with a slit pattern corresponding to the first protrusion, and a transparent pattern corresponding to the second protrusion.

Alternatively, the insulating layer may be formed with a negative photosensitive organic insulating material. In this case, the first and the second protrusions are formed through a mask with a semitransparent pattern corresponding to the first protrusion, and an opaque pattern corresponding to the second protrusion.

A photoresist pattern of different in thickness may be formed on the insulating layer through one photolithography process.

According to still another aspect of the present invention, in a method for fabricating the liquid crystal display, a thin film transistor array substrate is first formed such that the thin film transistor array substrate has a pixel electrode with a wiring line pattern, a switching circuit and an opening pattern. A color filter substrate is then formed such that the color filter substrate has a common electrode, a color filter, a high molecular pillar, and a protrusion pattern. The thin film transistor array substrate is combined with the color filter substrate, and a liquid crystal material is injected between the thin film transistor array substrate and the color filter substrate.

According to still another aspect of the present invention, in a method for fabricating a color filter substrate for the liquid crystal display, a black matrix and a color filter are formed on a transparent substrate in a sequential manner. An over-coat layer is formed on the color filter substrate. A common electrode is formed on the over-coat layer with a transparent conductive material. A photosensitive resin is coated onto the common electrode. The photosensitive resin is then exposed to light through a mask, and developed to thereby form a protrusion and a high molecular pillar of different height. The mask has a first pattern with an opening width smaller than the resolution of the light exposing device, and a second pattern with an opening width larger than the resolution of the light exposing device.

The protrusion has a width of 4-14 µm, and the high molecular pillar has a width of 15-45 µm. The protrusion has a height of 1.0-1.2 µm, and the high molecular pillar has a height of 3.0-4.5 µm.

The protrusion and the high molecular pillar may go through hard baking at a predetermined temperature such that the protrusion and the high molecular pillar bear a predetermined strength. The height of the protrusion and the high molecular pillar can be controlled through varying the hard baking temperature. The hard baking temperature is in the range of 200-240° C.

According to still another aspect of the present invention, a thin film transistor array substrate for the liquid crystal display includes a gate line assembly with a gate electrode and a gate line, and a data line assembly with a data line crossing over the gate line, a source electrode, and a drain electrode. A semiconductor pattern contacts the source and the drain electrodes while forming a thin film transistor together with the gate electrode, the source electrode, and the drain electrode. An organic insulating pattern is formed on the semiconductor pattern. The organic insulating pattern has a protrusion pattern with a first thickness, a contact hole exposing the drain electrode, and a flat portion with a second thickness. A pixel electrode is formed on the organic insulating pattern while being connected to the drain electrode through the contact hole.

The semiconductor pattern is formed with hydrogenated amorphous silicon. The semiconductor pattern has the same shape as the data line assembly except that the semiconductor pattern further has a channel region between the source and the drain electrodes. The semiconductor pattern is formed over the gate electrode with an island shape.

According to still another aspect of the present invention, in a method for fabricating the thin film transistor array substrate, a gate line assembly is formed on a substrate with a gate line and a gate electrode. A gate insulating layer is formed on the substrate such that the gate insulating layer covers the gate line assembly. A semiconductor pattern is formed on the gate insulating layer. A data line assembly is formed on the gate insulating layer and the semiconductor pattern with a data line, a source electrode, and a drain electrode. An organic insulating pattern is formed on the semiconductor pattern such that the organic insulating pattern has a protrusion pattern with a first thickness, a contact hole exposing the drain electrode, and a flat portion with a second thickness. A pixel electrode is formed on the organic insulating pattern such that the pixel electrode is connected to the drain electrode through the contact hole.

The organic insulating pattern is formed through the steps of forming a photosensitive organic insulating layer on an entire surface of the substrate with the data line assembly, exposing the photosensitive organic insulating layer in a selective manner such that the photosensitive organic insulating layer has a first portion intercepted from light where the protrusion pattern is formed, a second portion entirely exposed to light where the contact hole is formed, and a third portion partially exposed to light, and developing the selectively light-exposed organic insulating layer.

The step of selectively exposing the organic insulating layer to light is made through a mask with a light intercepting region placed over the first portion of the organic insulating layer, a light transmitting region placed over the second portion of the organic insulating layer, and a selectively light transmitting region placed over the third region while bearing a predetermined light transmission.

Alternatively, the step of selectively exposing the organic insulating layer to light may be made through a first mask for exposing the second portion of the organic insulating layer to light, and a second mask for exposing the third portion of the organic insulating layer to light with a predetermined light transmission.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components.

FIGS. 31A, 31B, 32A, 32B, 33A, 33B, 34A, 34B and 35 illustrate the steps of fabricating the thin film transistor array substrate shown in FIG. 29.

FIGS. 37 and 38 are cross sectional views of the thin film transistor array substrate taken along the XXXVII-XXXVII' line and the XXXVIII-XXXVIII' line of FIG. 36, FIGS. 39A, 39B, 39C, 40A, 40B, 40C, 41A, 41B, 42A, 42B, 43A, 43B, 44A, 44B, 45A, 45B, 46A, 46B, 46C, 47A and 47B illustrate the steps of fabricating the thin film transistor array substrate shown in FIG. 36.

DETAILED DESCRIPTION OF THE PREFERRED EMBODIMENTS

Preferred embodiments of this invention will be explained with reference to the accompanying drawings.

Figure 1:
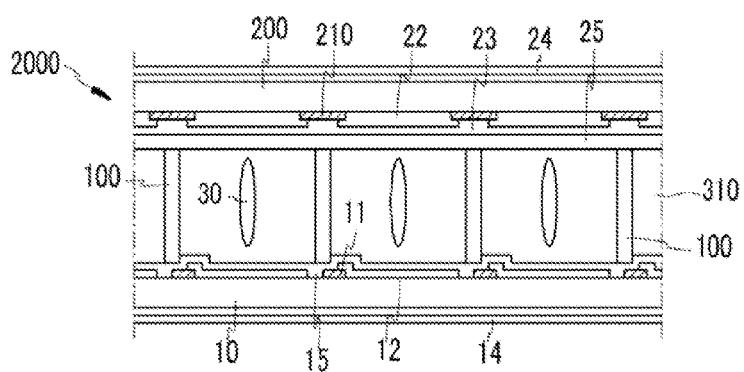
FIG. 1 is a schematic view of a liquid crystal display according to a first preferred embodiment of the present invention.

FIG. 1 is a schematic view of a liquid crystal display according to a first preferred embodiment of the present invention.

The liquid crystal display includes bottom and top substrates 1000 and 2000 arranged in parallel while facing each other, a liquid crystal layer 310 with liquid crystal molecules 300 sandwiched between the two substrates 1000 and 2000, and spacers 100 disposed between the substrates 1000 and 2000 to keep the inter-substrate distance constant. The liquid crystal molecules 300 are vertically aligned with respect to the substrates 1000 and 2000.

The bottom substrate 1000 is formed with a first insulating substrate 10, and pixel electrodes 80 internally placed on the first insulating substrate 10. The first insulating substrate 10 is formed of a transparent insulating material such as glass, and the pixel electrode 80 is formed of a transparent conductive material such as indium tin oxide (ITO) and indium zinc oxide (IZO). The pixel electrode 80 has an opening pattern (not shown), and is connected to a switching circuit 11 to receive picture signal voltages.

An alignment layer 90 is formed on the first insulating substrate 10 with the pixel electrodes 80 to align the liquid crystal molecules 300. A thin film transistor is used for the switching circuit 11. The thin film transistor is connected to a gate line (not shown) for transmitting scanning signals, and to a data line (not shown) for transmitting picture signals, respectively. The thin film transistor turns on or off in accordance with the scanning signals.

A bottom polarizing plate 14 is externally attached to the bottom substrate 1000. In a reflection type liquid crystal display, the pixel electrode 80 may be formed of a non-transparent material. In this case, the bottom polarizing plate 14 may be omitted.

The top substrate 2000 is formed of a second insulating substrate 200, a black matrix 210, color filters 220 of red, green and blue, a common electrode 230, and an alignment layer 250. The black matrix 210 prevents light leakage. The alignment layer 250 aligns the liquid crystal molecules 300. The common electrode 230 is formed with a transparent conductive material such as ITO and IZO while bearing an opening pattern (or a protrusion) (not shown). Alternatively, the black matrix 210 and the color filters 220 may be formed at the bottom substrate 1000. A top polarizing plate 400 is externally attached to the top substrate 2000.

The polarizing directions of the bottom and the top polarizing plates 14 and 400 are perpendicular to each other in a normally black mode, whereas those are in parallel to each other in a normally white mode. In this preferred embodiment, only the normally black mode is considered as example.

Figure 2:
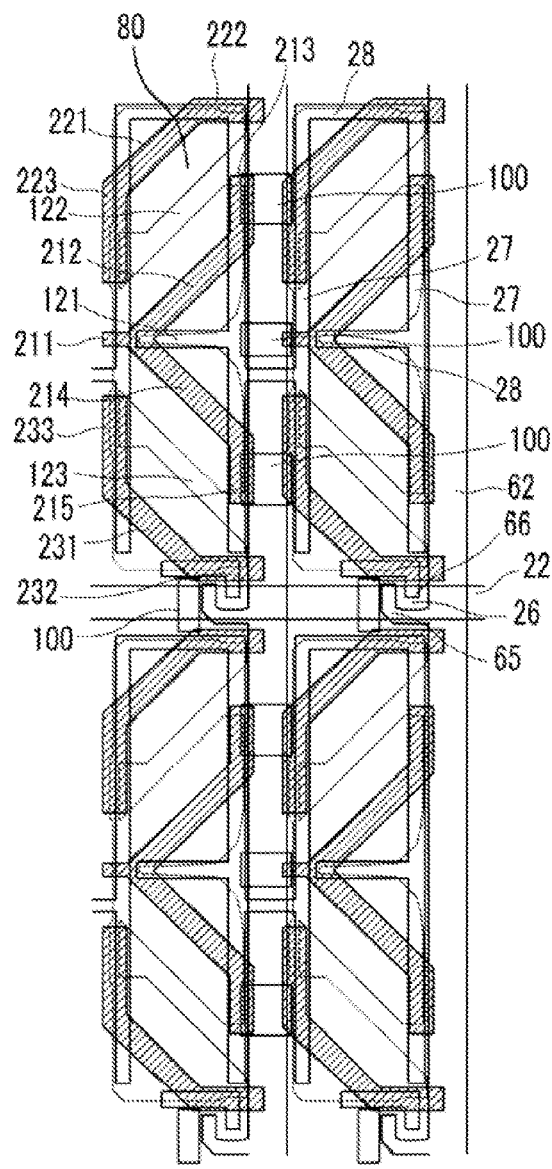
FIG. 2 is a schematic view of a liquid crystal display according to a second preferred embodiment of the present invention.

FIG. 2 illustrates the structure of a liquid crystal display according to a second preferred embodiment of the present invention.

As shown in FIG. 2, a bottom substrate with a pixel electrode and a top substrate with a common electrode are arranged in parallel. Each of the pixel electrode and the common electrode is provided with an opening pattern (or a protrusion).

A gate line assembly is formed on the bottom substrate. The gate line assembly includes gate lines 22 for transmitting gate signals, and gate electrodes 26 connected to the gate lines 22 to form a thin film transistor together with other components.

Furthermore, a data line assembly is formed on the bottom substrate. The data line assembly includes data lines 62 for transmitting data signals while crossing over the gate lines 22 to define pixels, source electrodes 65 connected to the data lines 62 to function as a part of the thin film transistor, and drain electrodes 66 facing the source electrodes 65 around the gate electrodes 26. A pixel electrode 80 is electrically connected to the drain electrode 66 to receive the data signals.

Furthermore, storage capacitor lines 27 and 28 are placed around the periphery of the unit pixel and overlap the pixel electrode 80 to form a storage capacitor. The storage capacitor lines 27 and 28 prevent light leakage at the periphery of the unit pixel.

As shown in FIG. 2, the pixel electrode 80 is provided with a first opening portion 821. The first opening pattern 821 tapers from the left side to the right at the center of the pixel electrode 80. The edges of pixel electrode 80 from which the first opening pattern 821 proceeds are cut off, and smoothly curved.

A second opening portion 822 and a third opening portion 823 are formed at the upper half region and the lower half region of the pixel electrode 80 around the first opening portion 821. The second opening portion 822 and the third opening portion 823 diagonally proceed at the upper region and the lower region of the pixel electrode 80 symmetrically. The second opening portion 822 and the third opening portion 823 proceed from the right side to the left side at the upper region and the lower region of the pixel electrode 80 while gradually approaching the first opening portion 821.

The pixel electrode 80 is protruded to the outside at the area where the second opening portion 822 and the third opening portion 823 are terminated. It is protruded to prevent failure in the interconnection of the respective portions of the pixel electrode 80 due to the opening portions 822 and 823.

Meanwhile, fourth, fifth and sixth opening portions (or first, second and third protrusion portions) are formed at the common electrode 230. The fourth opening portion (or first protrusion portion) includes a trunk 211 proceeding in the horizontal direction, and a first body 212 and a second body 214 that obliquely extended from the trunk 211 upward and downward, and a first branch 213 and a second branch 215 that extended along the pixel electrode from the first body 212 and the second body 214 upward and downward.

The fifth opening portion (or second protrusion portion) includes a third body 221 proceeding slantingly parallel to the first body 212, a third horizontal branch 222 proceeding along the pixel electrode from the third body 221 in the horizontal direction, a third vertical branch 223 proceeding along the pixel electrode from the third body 221 in the vertical direction. The sixth opening portion (or third protrusion portion) includes a fourth body 231 proceeding slantingly parallel to the second body 214, a fourth horizontal branch 232 proceeding along the pixel electrode from the fourth body 231 in the horizontal direction, a fourth vertical branch 233 proceeding along the pixel electrode from the fourth body 231 in the vertical direction. That is, the fifth and the sixth opening portions (or second and third protrusion portions) are formed at the upper half region and the lower half region of the unit pixel of the common electrode 230 symmetrical to each other. The fourth, the fifth and the sixth opening portions (or first, second and third protrusion portions) are repeatedly formed at the respective pixels of the common electrode 230. As shown in FIG. 2, a second opening 822 is substantially orthogonal to a third opening 823, and at least one opening (or at least one protrusion) (212, 214, 221, 231) which is formed at the common electrode includes a branch (213, 215, 222, 223, 232, 233) that meets at an acute angle with an end portion of at least one of the openings (822, 823).

As shown in FIG. 2, the first opening portion 821, the second opening portion 822 and the third opening portion 823 of the pixel electrode 80 are overlapped with the fourth, fifth and sixth opening portions (or the first, second and third protrusion portions) of the common electrode 230 such that the pixel electrode area is divided into several domains. The opening portions of the pixel electrode 80 and the opening portions (or protrusion portions) of the common electrode 230 are arranged in an alternate manner while proceeding in parallel.

In this structure, under the application of an electric field, the liquid crystal molecules at one unit pixel are aligned in four directions along the directions of the fringe fields due to the opening portions. Therefore, wide viewing angle can be obtained in four directions.

Spacers 100 are formed at the ends of the opening portions (or protrusion portions) of the common electrode 230 of an organic material to maintain the distance between the two substrates constant. The spacers 100 prevent disclination at the ends of the opening portions (or protrusion portions) where the directors of the liquid crystal molecules are not oriented uniformly.

When driving voltages are applied to the pixel electrode 80 and the common electrode 230, electric fields are not uniformly formed at the ends of the opening portions (or protrusion portions) so that the inclination of the electric field is seriously changed while breaking off the normal orientation of the liquid crystal molecules.

The spacers made of an organic material can prevent the disclination while maintaining the distance between the two substrates even when an external impact is applied, thereby preventing deterioration of the brightness.

The opening patterns (or the protrusions) may bear various shapes to make partitioned areas of different orientations of the liquid crystal molecules, but they usually meet the following requirements.

First, in order to obtain the best viewing angle, it is preferable that four-partitioned regions should be placed within one pixel.

Second, in order to obtain stable orientation of the liquid crystal molecules, disclination or non-uniform texture should not be generated at the outside of the partitioned microregions. Disclination is made where the directors of the liquid crystal molecules are oriented in various directions, and particularly where the liquid crystal molecules at one region are inclined against one another. Therefore, in order to achieve stable partitioned-orientation, the opening patterns (or the opening patterns and protrusions) of the top and the bottom substrates are alternately arranged while being close to each other at the end portions thereof.

That is, when viewed from the top, the region surrounded by the opening patterns (or the opening patterns and the protrusions) of the top and bottom substrates should bear a shape of closed polygons. Meanwhile, in case the opening pattern (or protrusion) has edges of acute angle, disclination is liable to occur. Thus, the opening pattern (or protrusion) should be formed at an obtuse angle. Stable partitioned-orientation also influences the brightness. In the regions of scattered orientation, light leaks at an off state, and a darker image is displayed at an on-state compared to other regions. When the orientation of the liquid crystal molecules changes, the regions of scattered orientation float and cause afterimages.

Third, in order to obtain high brightness, the following conditions should be met. The angle between the directors of the liquid crystal molecules at the neighboring regions should be 90°. In this state, disclination is made at the narrowest region. Also, when the angle between the light transmission axis of the polarizing plate and the director of the liquid crystal molecule is 45°, the highest brightness can be obtained.

Finally, in order to obtain a rapid response speed, it is preferable that the opening patterns (or protrusions) of the top and bottom substrates should not be much bent or curved.

Figure 3:
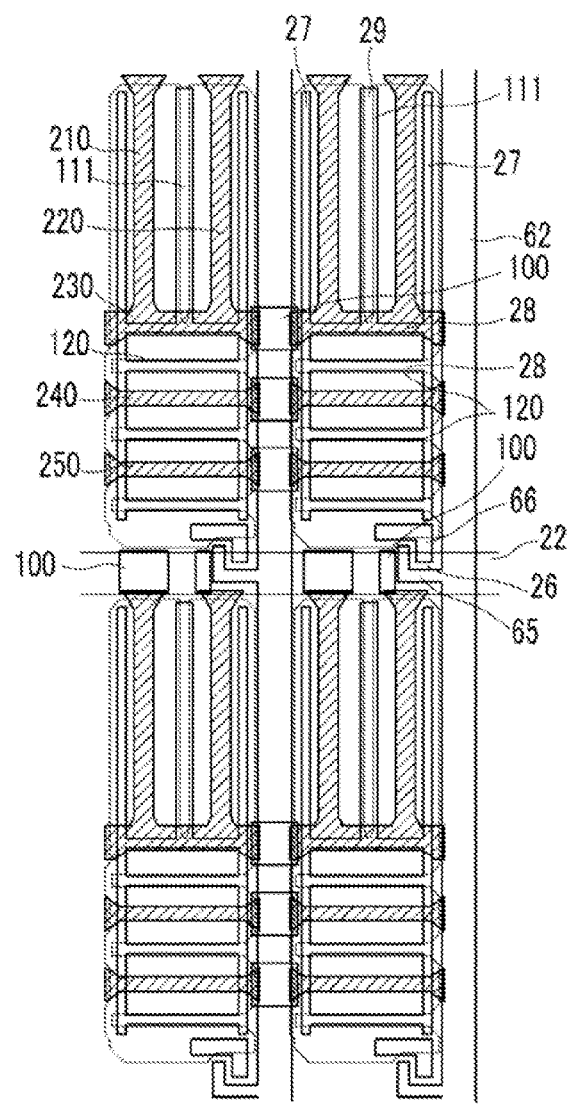
FIG. 3 is a schematic view of a liquid crystal display according to a third preferred embodiment of the present invention.

FIG. 3 is a schematic view of a liquid crystal display according to a third preferred embodiment of the present invention.

As shown in FIG. 3, the structure of the gate and data line assemblies is the same as that of the second preferred embodiment.

Storage capacitor lines 27, 28 and 29 are formed at the periphery of the unit pixel as well as at the area where the opening portions 111 and 112 of the pixel electrode 80 are placed.

The pixel electrode 80 has a first opening portion 111 placed at the upper half region thereof in the vertical direction, and a second opening portion 112 placed at the lower half region thereof in the horizontal direction. The first opening portion 111 divides the pixel electrode 80 into two left and right regions. The second opening pattern 112 divides the lower half region of the pixel electrode 80 into four microregions.

A third opening portion (or a first protrusion portion) is formed at the unit pixel of the common electrode 230. The third opening portion (or the first protrusion portion) includes a first linear element 241 and a second linear element 242 vertically arranged parallel to each other, and a third linear element 243 proceeding in the horizontal direction while dividing the unit pixel of the common electrode 230 into two upper and lower regions.

Furthermore, a fourth opening portion (or a second protrusion portion) 244 and a fifth opening portion (or a third protrusion portion) 245 are formed at the lower pixel region of the common electrode 230 while horizontally proceeding parallel to each other. The ends of the third through the fifth opening portions (or protrusion portions) 241 through 245 are gradually enlarged in width while forming a triangle shape.

As shown in FIG. 3, the first opening portion 111 and the first linear element 241 and the second linear element 242 of the third opening portion (or first protrusion portion) are alternately arranged in parallel at their centers while vertically partitioning the upper region of the pixel electrode 80 into four micro-regions. The second opening portion 112, the third linear element 243 of the third opening portion (or first protrusion portion), and the fourth and the fifth opening portions (or the second and the third protrusion portions) 244 and 245 are alternately arranged in parallel at their centers while horizontally partitioning the lower region of the pixel electrode 80 into six micro-regions.

Spacers 100 are formed at the ends of the opening portions or protrusion portions of the common electrode 230 between the neighboring pixels with an organic material. These spacers 100 have the same function as previously described in the first preferred embodiment.

Alternatively, it is possible that an opening pattern is formed at the common electrode, and protrusions are formed at the pixel electrode together with an opening pattern. In this case, the protrusions may be formed together with a gate insulating layer or a protective layer. It should be noted in forming such protrusions that a parasitic static capacitance may be formed between the protrusions and the neighboring lines. It is also possible that an opening pattern is formed at the pixel electrode, whereas protrusions are formed at the common electrode.

As described above, in the liquid crystal display according to the first, second and third preferred embodiments, organic material-based spacers may be formed at the desired place to maintain the distance between the substrates in a constant manner, preventing disclination as well as the brightness deterioration.

Figure 4:
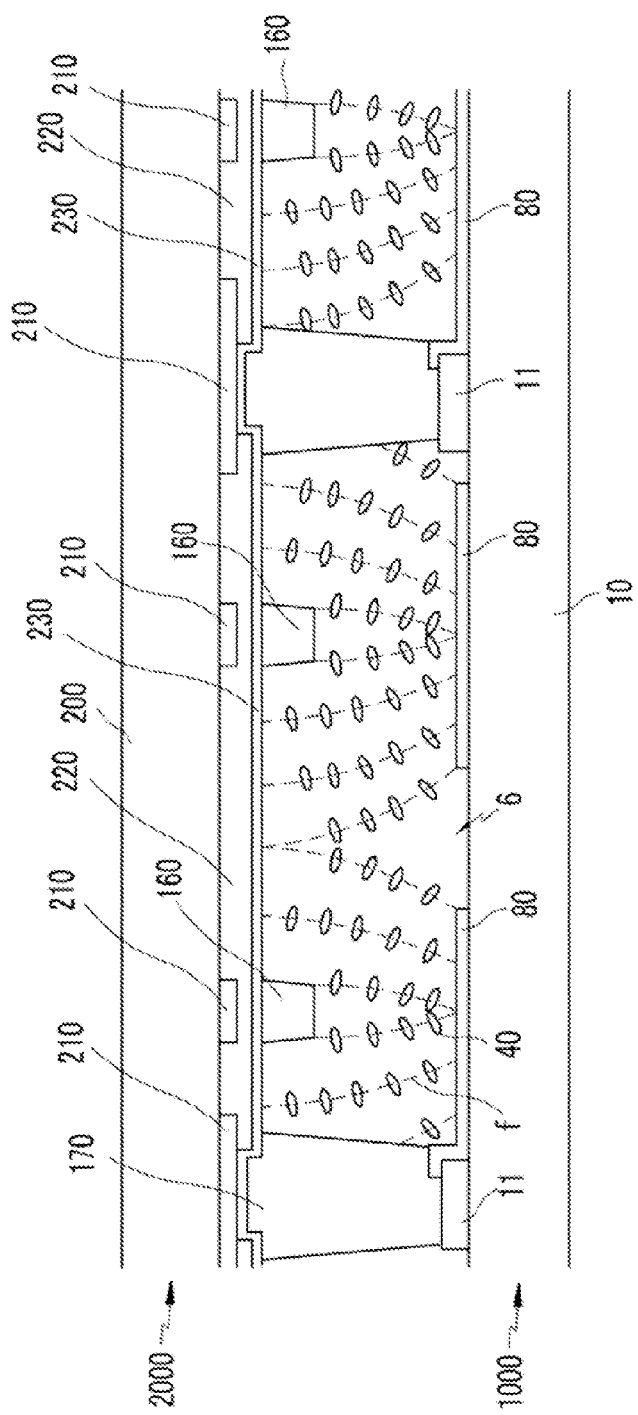
FIG. 4 is a sectional view of a liquid crystal display according to a fourth preferred embodiment of the present invention.

FIG. 4 is a sectional view of a liquid crystal display according to a fourth preferred embodiment of the present invention where a thin film transistor array substrate and a color filter substrate are arranged while facing each other.

As shown in FIG. 4, the thin film transistor array substrate 1000 has a first insulating substrate 10, a thin film transistor 11 formed on the first insulating substrate 10, and a pixel electrode 80 electrically connected to the thin film transistor 11 while bearing an opening pattern 6. The color filter substrate 2000 has a second insulating substrate 200, a black matrix 210, color filters 220, and a common electrode 230.

In the color filter substrate 2000, the black matrix 210 is formed on the second insulating substrate 200, and the color filters 220 of red, green and blue are surrounded by the black matrix 210. The common electrode 230 is formed on the entire surface of the substrate 200 with indium tin oxide (ITO) or indium zinc oxide (IZO) while covering the black matrix 210 and the color filters 220. The portion of the common electrode 230 placed on the black matrix 210 is sunken compared to that placed on the color filter 220. First photosensitive organic insulating patterns (that is, protrusions) 160 and second photosensitive organic insulating patterns (that is, spacers) 170 are formed on the common electrode 230. The first and second organic insulating patterns 160 and 170 have different thickness. The first organic insulating pattern (protrusion) 160 over the color filter 220 are thinner than the second organic insulating pattern (spacers) 170 over the black matrix 210.

In the thin film transistor array substrate, the pixel electrode 80 is formed on the first insulating substrate 10 while bearing an opening pattern 6. The thin film transistor 11 is also formed on the first insulating substrate 10 to switch the signals applied to the pixel electrode 80. A drain electrode is electrically connected to the pixel electrode 80 as a part of the thin film transistor 11.

Under the application of voltage to the common electrode 230 and the pixel electrode 80, fringe fields f shown in FIG. 4 are formed. The liquid crystal molecules 40 are oriented in four directions due to the fringe fields so that the desired multi-domains can be obtained without patterning the common electrode 230.

The organic insulating patterns 160 and 170 may be formed of at least one of a photosensitive organic insulating material, a positive photosensitive material, a negative photosensitive material and a silicon-based insulating material.

The fringe fields f are formed by way of the second organic insulating pattern 160 bearing a thin thickness while forming multiple micro-regions, resulting in wide viewing angle. The first organic insulating pattern 170 positioned corresponding to the thin film transistor 11 functions as a spacer for maintaining the gap between the substrates 1000 and 2000 called the "cell gap." As the thickness of the cell gap is at best 3-4 μm, the response speed can be enhanced.

Furthermore, the second organic insulating pattern 160 for forming the fringe field f and the first organic insulating pattern 170 used for the spacer are formed through one photolithography process, thereby simplifying the number of processing steps.

A method for fabricating the color filter substrate will be now explained with reference to FIGS. 5 through 14.

Figure 5:
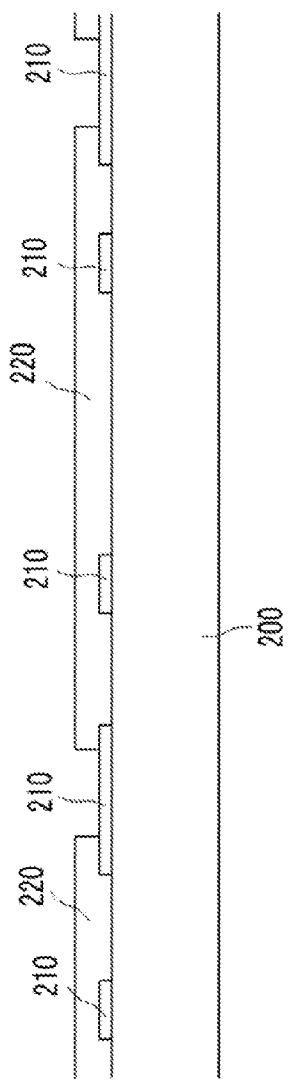
FIGS. 5, 6, 7, 8, 9, 10, 11, 12, 13 and 14 sequentially illustrate the steps of fabricating a color filter substrate for the liquid crystal display shown in FIG. 4.

First, as shown in FIG. 5, a black matrix 210 is formed on an insulating substrate 200, and color filters 220 of red, green and blue are formed at the black matrix 210.

Figure 6:
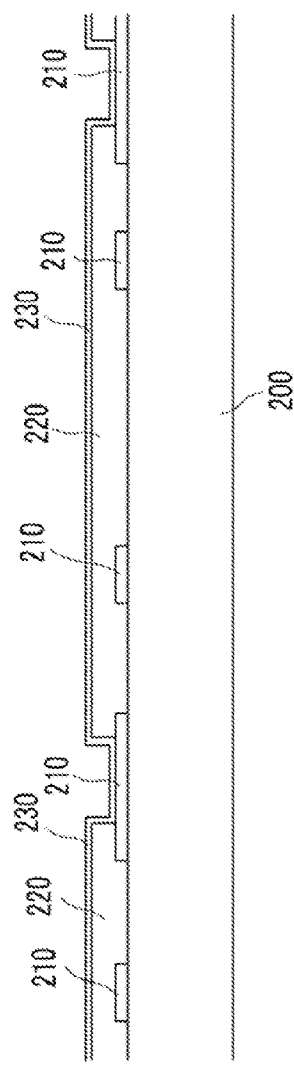

Then, as shown in FIG. 6, a common electrode 230 is formed on the entire surface of the substrate 200 with a transparent conductive material such as ITO and IZO such that it covers the black matrix 210 and the color filters 220.

Figure 7:
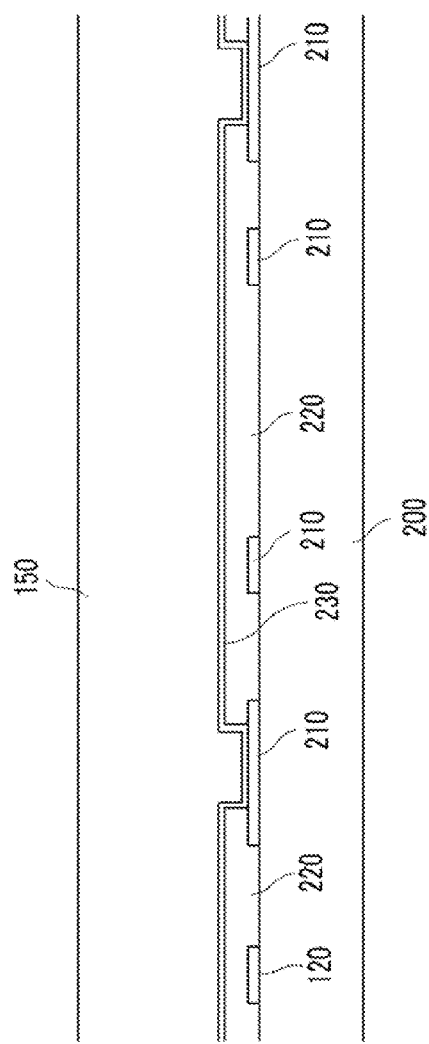

As shown in FIG. 7, a photosensitive organic insulating layer 150 is deposited onto the common electrode 230. At this time, a negative or positive photosensitive layer, or a silicon-based insulating layer may be deposited onto the common electrode 230 instead of the photosensitive organic insulating layer 150.

Figure 8:
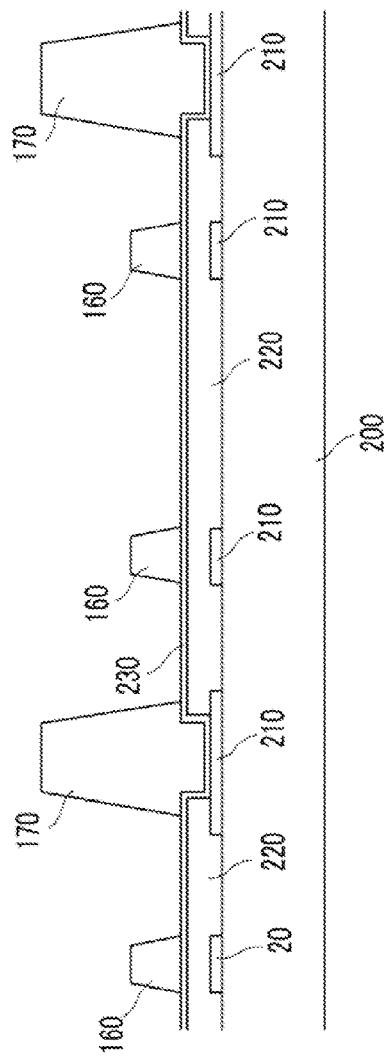

As shown in FIG. 8, the photosensitive organic insulating layer 150 is patterned through a mask to thereby form photosensitive organic insulating patterns 160 and 170. The resulting photosensitive organic insulating patterns 160 and 170 have different thickness. It is preferable that the mask should bear a slit pattern or a semitransparent film.

A method for forming such organic insulating patterns using a mask with a slit pattern will be now explained with reference to FIGS. 8 and 9.

Either a negative photosensitive material or a positive photosensitive material may be used to form the organic insulating layer. In case a negative photosensitive material is used for the organic insulating layer, only the light-exposed portions of the organic insulating layer are left over after the development.

Figure 9:
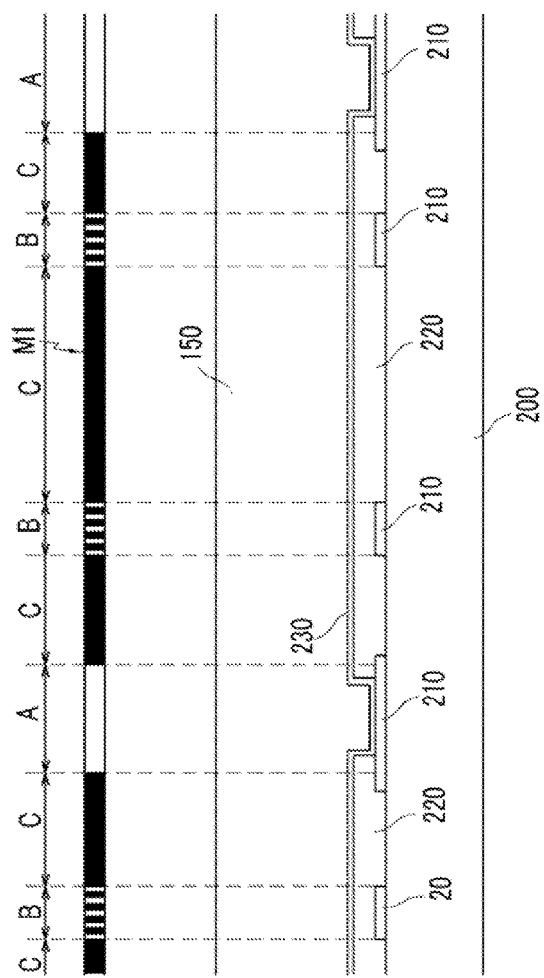

As shown in FIG. 9, the mask M1 includes a slit pattern placed at the B area over the color filter 220, a transparent pattern placed at the A area over the black matrix A, and an opaque pattern at the remaining C area.

When the light exposing is made using such a mask M1, larger amount of light passes the transparent pattern than the slit pattern. Therefore, when the photosensitive organic insulating layer 150 is light-exposed and developed, as shown in FIG. 8, the thickness of the negative organic insulating layer 160 remaining at the B area is thinner than the negative organic insulating layer 170 remaining at the A area, and the negative organic insulating film 160 is absent at the C area.

In the case for an organic insulating layer bearing a negative photosensitivity, the upper side thereof becomes wider than the lower side thereof after the development while forming a counter-tapering shape. But, in the subsequent processing steps, the upper side of the organic insulating layer is reduced in thickness while forming a perpendicularly proceeding pattern.

A method of forming organic insulating patterns using a mask with a semitransparent film will be now explained with reference to FIGS. 8 and 10.

Either a negative photosensitive material or a positive photosensitive material may be used to form an organic insulating layer. In case the organic insulating layer is formed with a positive photosensitive material, the light-exposed portions thereof are removed after the development.

Figure 10:
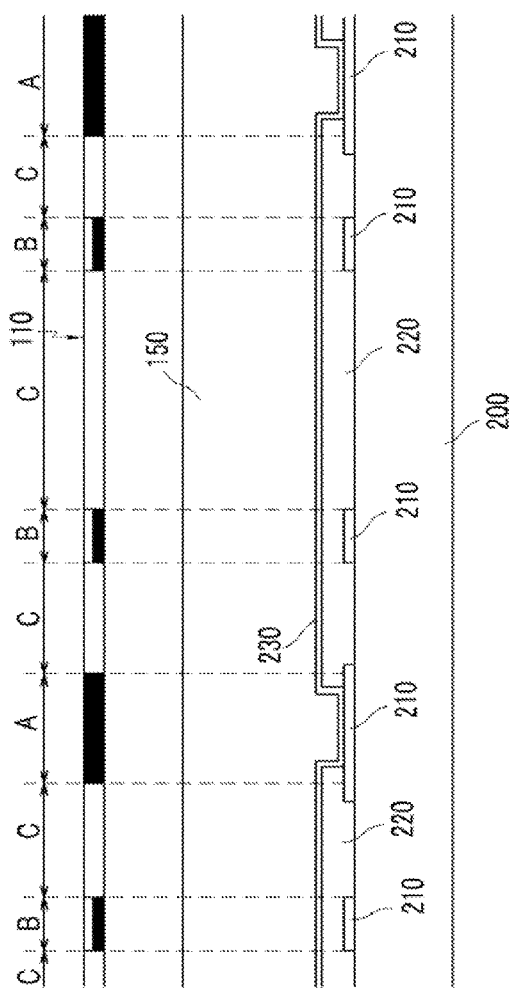

As shown in FIG. 10, the mask M2 includes a semitransparent film placed at the B area over the color filter 220, an opaque pattern placed at the A area over the black matrix 210, and a transparent pattern placed at the remaining C area.

When the substrate is exposed to light using the mask M2, larger amount of light passes the transparent pattern than the semitransparent pattern. Therefore, when the organic insulating layer is light-exposed and developed, the positive organic insulating layer remaining at the B area is thinner than the positive organic insulating layer remaining at the A area, and the positive organic insulating layer is absent at the C area.

If a negative organic insulating layer that leaves the light-exposed portions after the development is used to form the organic insulating patterns, it becomes difficult to make the portions covered by the semitransparent film have the desired thickness after the development. Thus, it is advantageous to use a positive organic insulating layer in forming the organic insulating patterns.

In this way, the organic insulating patterns 160 and 170 of different thickness are formed using the mask with a slit pattern or a semitransparent film. The thin organic insulating pattern 160 is used to form fringe fields. The thick organic insulating pattern 170 is used for a spacer.

As described above, the organic insulating patterns 160 and 170 of different thickness are formed through one photolithography process, which minimizes the number of relevant processing steps.

Meanwhile, a silicon-based insulating layer may be used instead of the photosensitive organic insulating layer. In this case, a silicon-based insulating layer is deposited onto the substrate, and a photoresist film is coated onto the insulating layer. The substrate with the insulating layer and the photoresist film goes through the photolithography process using a mask with a slit pattern or a semitransparent film. In this preferred embodiment, a negative photosensitive film is used for the photoresist film.

Figure 11:
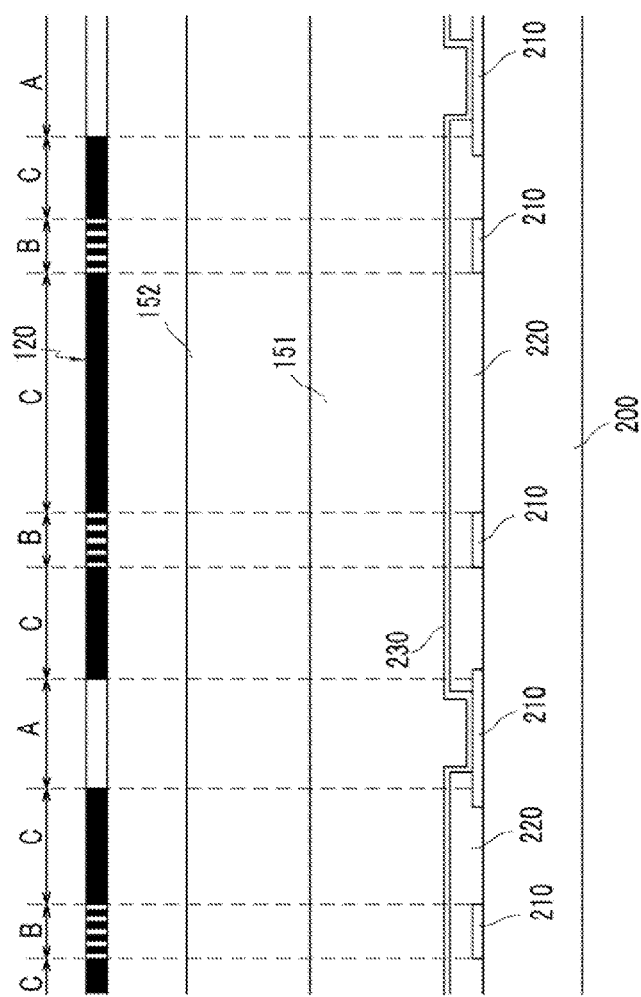
Figure 12:
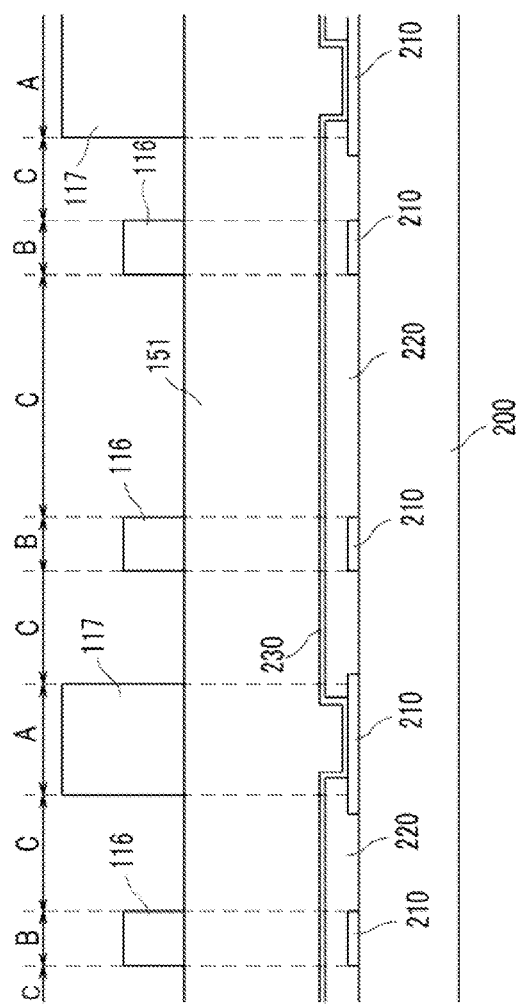

As shown in FIG. 11, a photoresist film 152 is coated onto a silicon-based insulating layer 151, and patterned through a mask M3 to thereby form photoresist patterns 116 and 117. As shown in FIG. 12, the photoresist patterns 116 and 117 have different thickness.

The mask M3 includes a slit pattern placed at the B area, an opaque pattern placed at the A area, and a transparent pattern placed at the C area. When the photoresist film is light-exposed through the mask M3 and developed, the photoresist film remaining at the B area is thinner than the photoresist film remaining at the A area. The photoresist film is absent at the C area.

The slit pattern placed at the B area may be replaced by a semi-transparent pattern.

In case a negative photoresist film is used instead of the positive photoresist film, the mask is structured to have a transparent pattern placed at the A area, and an opaque pattern placed at the C area.

Figure 13:
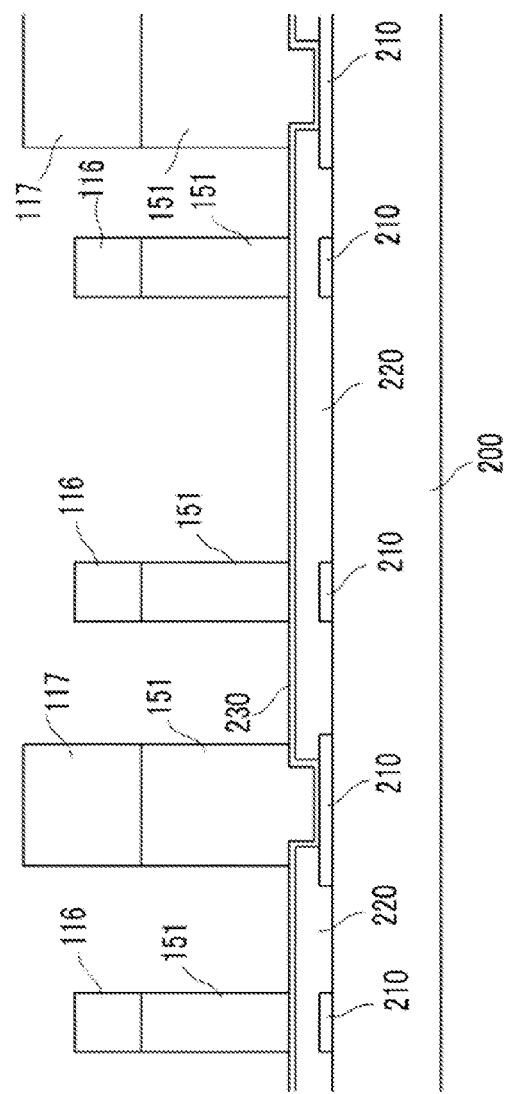

Thereafter, as shown in FIG. 13, the portions of the insulating layer 151 exposed through the photoresist patterns 116 and 117 are etched while exposing the underlying common electrode 230.

Figure 14:
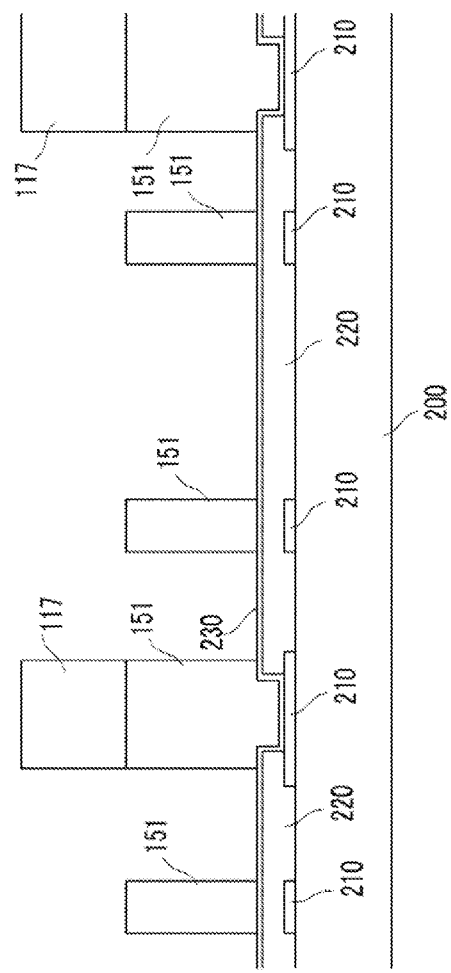

As shown in FIG. 14, the photoresist patterns 116 and 117 are removed such that only the photoresist pattern 117 placed at the A area is left over with a predetermined thickness.

The residual photoresist pattern 117 is removed so that insulating patterns 160 and 170 of different thickness are completed as shown in FIG. 8.

As described above, in the liquid crystal display according to the fourth preferred embodiment, the desired multi-domains are made using fringe fields due to the thin organic insulating pattern without patterning the common electrode of the color filter substrate so that wide viewing angle can be obtained. Furthermore, the thick organic insulating pattern functions as a spacer to maintain the cell gap in a uniform manner. In this structure, the cell gap becomes so small that enhances the response speed. Such organic insulating patterns are formed through one photolithography process while reducing the number of relevant processing steps.

FIGS. 15A through 23B sequentially illustrate the steps of fabricating a liquid crystal display with a thin film transistor array substrate and a color filter substrate.

The process of fabricating the thin film transistor array substrate will be first explained with reference to FIGS. 15A through 19B.

Figure 15A:
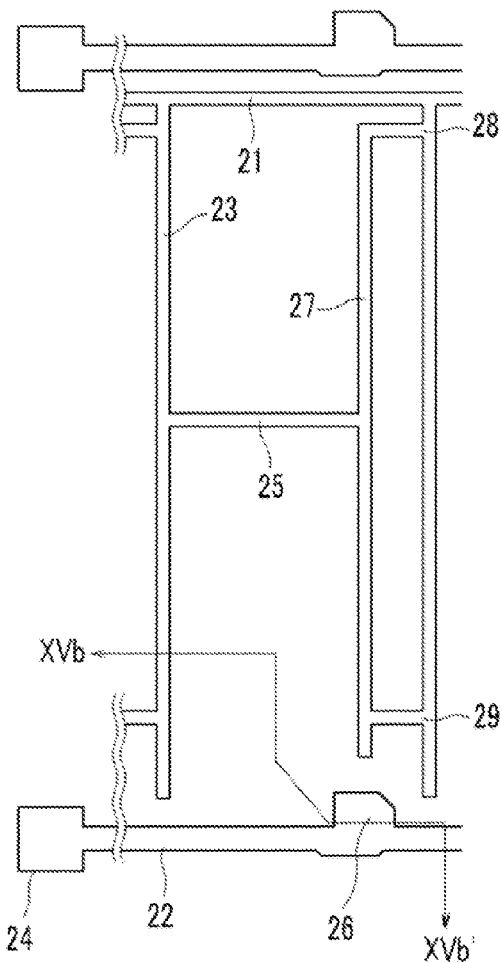
FIGS. 15A, 15B; 16A, 16B, 17A, 17B, 18A, 18B, 19A, 19B, 20A, 20B, 21, 22, 23A and 23B illustrate the steps of fabricating a thin film transistor array substrate and a color filter substrate for a liquid crystal display according to a fifth preferred embodiment of the present invention
Figure 15B:
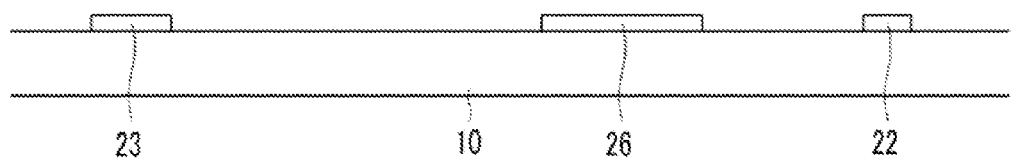

As shown in FIGS. 15A and 15B, a conductive layer of 1000-3000 Å is deposited onto an insulating substrate 10 through sputtering, and patterned through photolithography to thereby form a gate line assembly, and a storage capacitor line assembly. The gate line assembly includes gate lines 22, gate pads 24, and gate electrodes 26. The storage capacitor line assembly includes storage capacitor lines 21, storage capacitor electrodes 23, 25 and 27, and storage capacitor electrode connectors 28 and 29.

The storage capacitor line assembly may be formed in various shapes.

Figure 16A:
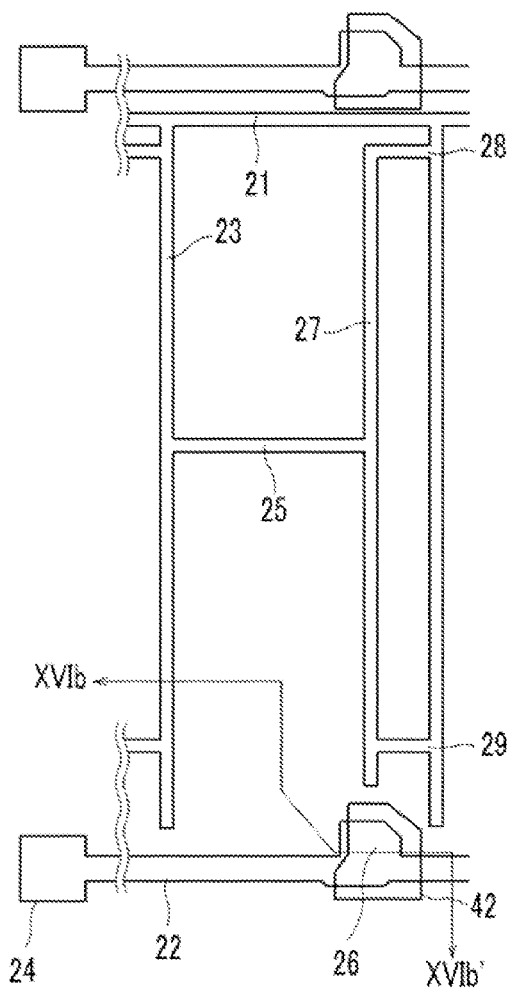
Figure 16B:
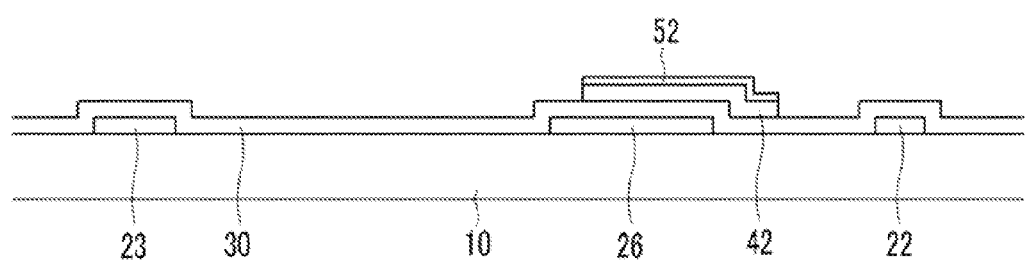

Thereafter, as shown in FIGS. 16A and 16B, a gate insulating layer of 1500-5000 Å, an amorphous silicon layer of 500-1500 Å, an impurities-doped amorphous silicon layer of 300-600 Å are sequentially deposited onto the entire surface of the substrate 10. The impurities-doped amorphous silicon layer and the amorphous silicon layer are patterned through photolithography to thereby form an ohmic contact pattern 52 and a semiconductor pattern 42.

Figure 17A:
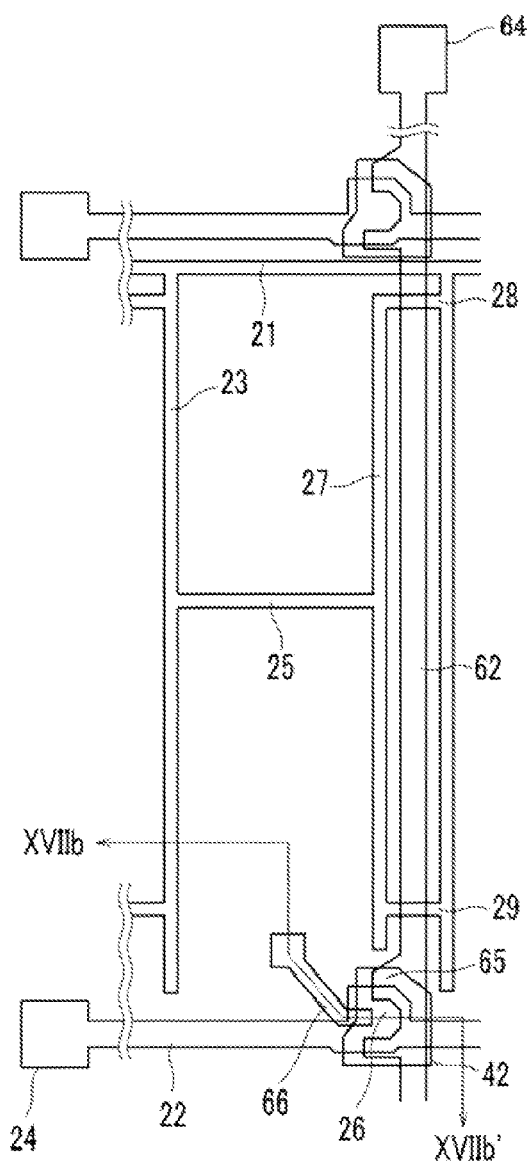
Figure 17B:
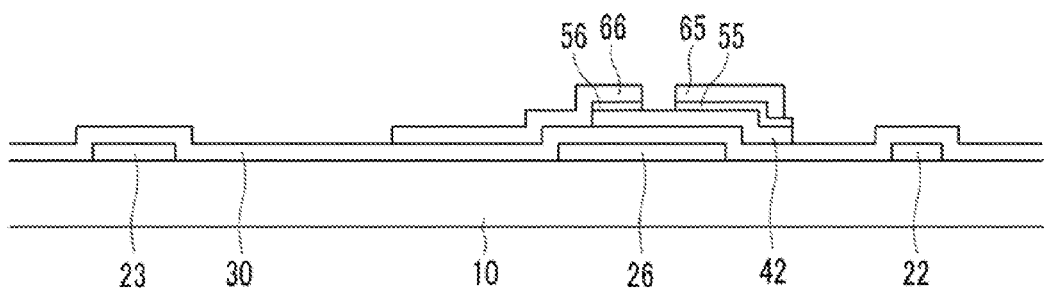

As shown in FIGS. 17A and 17B, a metallic conductive layer of 1500-3000 Å is deposited onto the substrate 10, and patterned through photolithography to thereby form a data line assembly. The data line assembly includes data lines 62, data pads 64, source electrodes 65, and drain electrodes 66.

The ohmic contact layer 52 is etched using the source and the drain electrodes 65 and 66 as a mask to thereby form an ohmic contact pattern 55 connected to the source electrode 65, and an ohmic contact pattern 56 connected to the drain electrode 66.

Figure 18A:
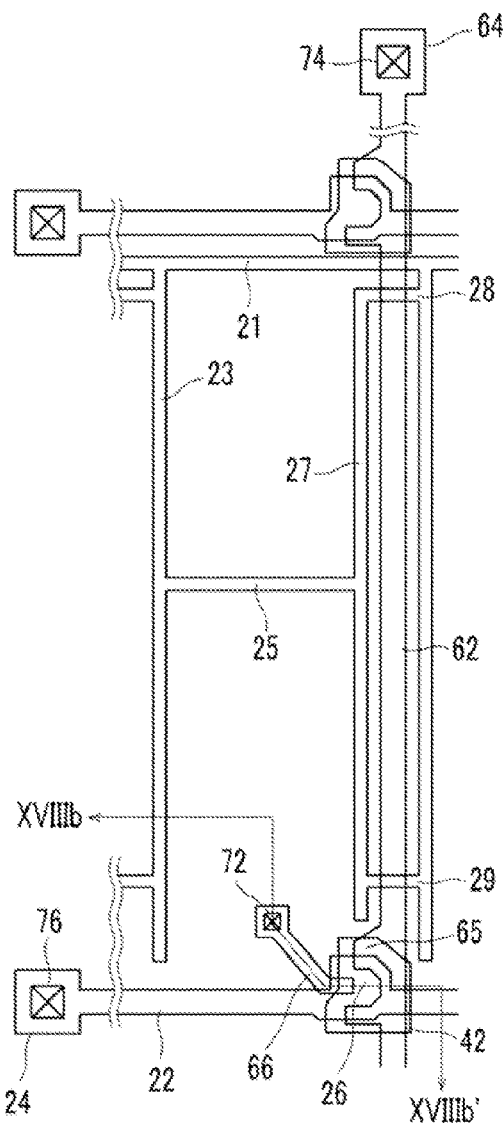
Figure 18B:
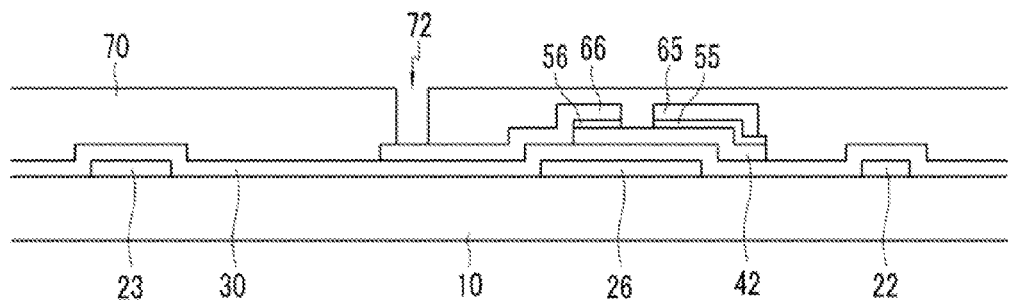

Then, as shown in FIGS. 18A and 18B, silicon nitride is deposited onto the substrate 10 through chemical vapor deposition, or an organic insulating film is spin-coated thereon to form a protective layer 70.

The protective layer 70 and the gate insulating layer 30 are patterned through photolithography to thereby form first contact holes 72 exposing the drain electrodes 66, second contact holes 74 exposing the data pads 64, and third contact holes 76 exposing the gate pads 24.

When the protective layer 70 is formed with the same material as the gate insulating layer 30, the two insulating layers 30 and 70 can be etched through only one photolithography process to form the contact holes 72, 74 and 76. Furthermore, in case the protective layer 70 is formed with a material different from the gate insulating layer, the protective layer 70 is first patterned, and the underlying gate insulating layer is etched using the protective layer as a mask to form the contact holes 72, 74 and 76.

Figure 19A:
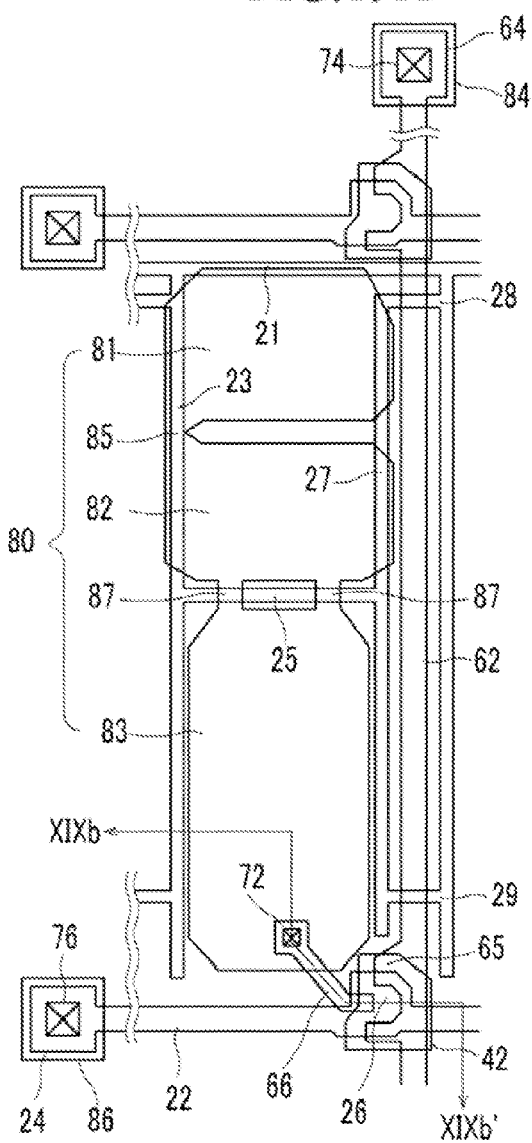
Figure 19B:
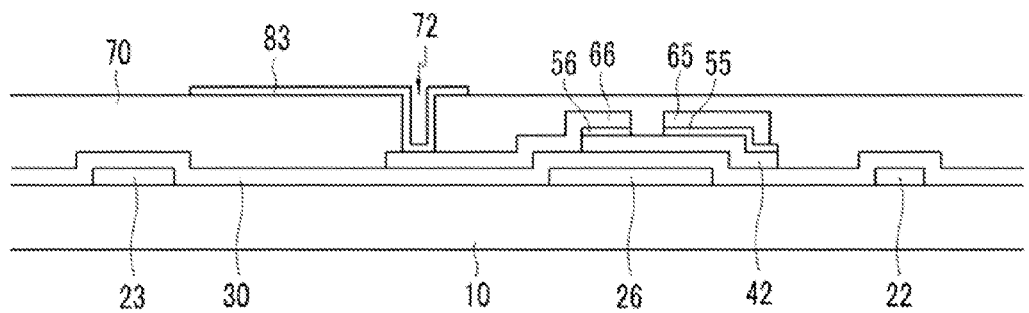

Thereafter, as shown in FIGS. 19A and 19B, an ITO or IZO-based layer of 400-500 Å is deposited onto the entire surface of the substrate 10 with the protective layer 70 through sputtering. The ITO or IZO-based layer is patterned through photolithography to thereby form pixel electrodes 80 connected to the drain electrodes 66 through the first contact holes 72, and subsidiary data and gate pads 84 and 86 connected to the data and gate pads 64 and 24 through the second and third contact holes 74 and 76.

Each pixel electrode 80 is patterned to be divided into a first portion 81, or second portion 82 and a third 83. These are connected to each other via the connectors 85 and 87. The pixel electrode 80 may be formed with various shapes.

The process of fabricating the color filter substrate will be then explained with reference to FIGS. 20A through 23B.

Figure 20A:
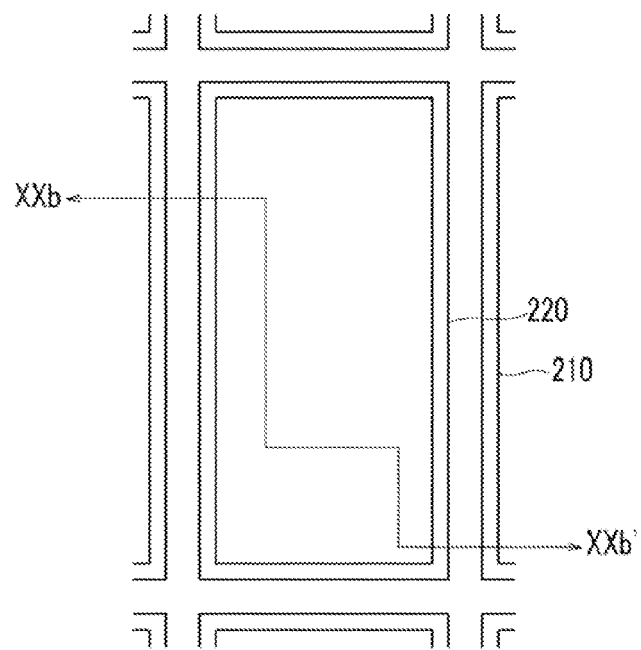
Figure 20B:
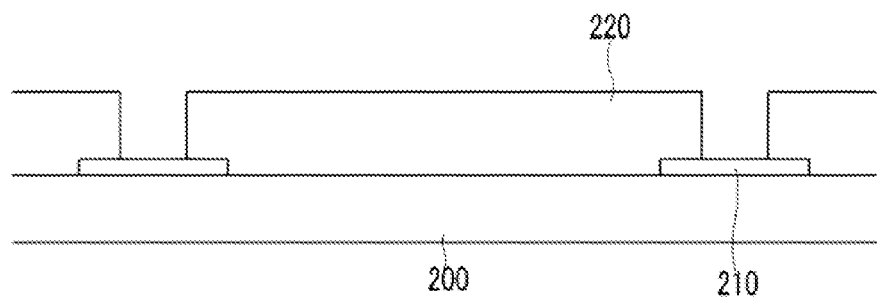

As shown in FIGS. 20A and 20B, a black matrix 210 is formed on an insulating substrate 200 with a double-layered structure of chrome/chrome oxide, and color filters 220 of red, green and blue are formed at the black matrix 210.

Figure 21:
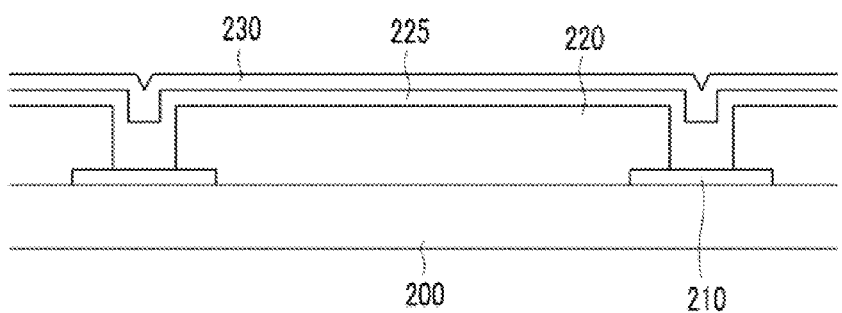

As shown in FIG. 21, an over-coat layer 225 is formed on the color filter 220, and a common electrode 230 is formed on the entire surface of the substrate 200 of a transparent conductive material such as ITO and IZO.

Figure 22:
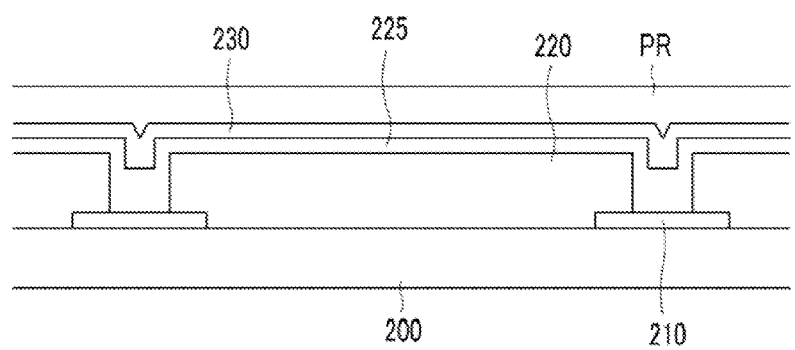

Thereafter, as shown in FIG. 22, a positive photosensitive resin PR is coated onto the entire surface of the substrate 200.

The photosensitive resin PR is used to form high molecular pillars and protrusions. For instance, the photoresist resin PR is spin-coated onto the substrate 10 at 400 rpm to a thickness of 3.8 μm.

Figure 23A:
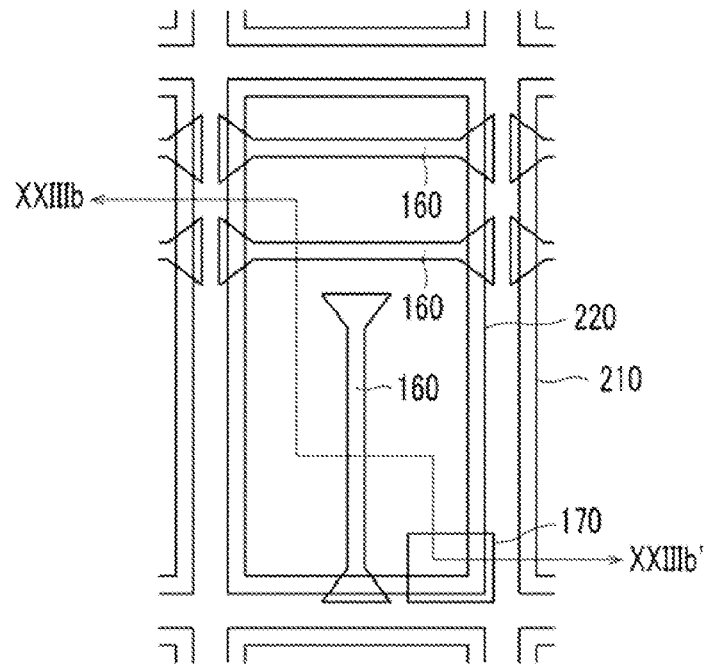
Figure 23B:
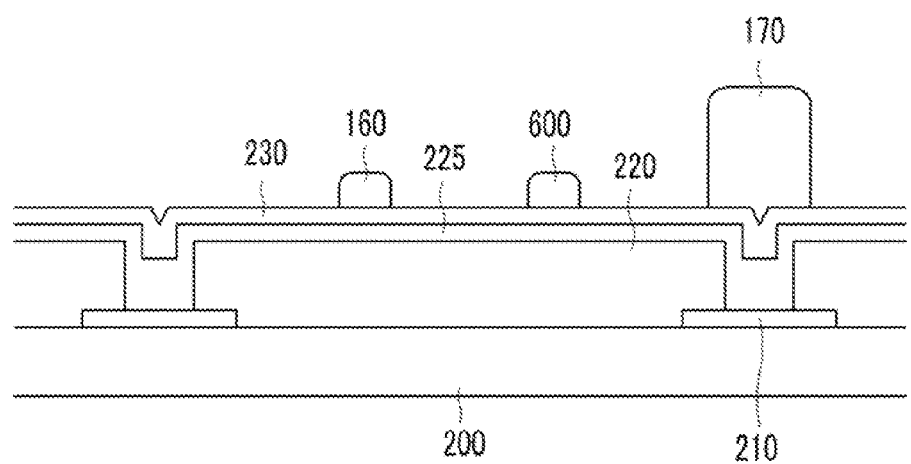

Then, as shown in FIGS. 23A and 23B, protrusions 160 and high molecular pillars 170 are formed. The protrusions 160 and the high molecular pillars 170 may be formed at various portions of the substrate 200.

The protrusions 160 and the high molecular pillars 170 of different heights may be simultaneously formed through one photolithography process using one mask. The opening width of the mask pattern (called the "pattern width") corresponding to the protrusion 160 is set to be smaller than the resolution of the light exposing device. The opening width of the mask pattern corresponding to the high molecular pillar 170 is set to be larger than the resolution of the light exposing device.

It is preferable that the protrusion 160 bears a height of 1.0-1.2 μm, and the high molecular pillar 170 bears a height of 3.0-4.5 μm. The amount of light exposure is controlled to be 300 mJ/cm². Furthermore, the width of the protrusion 160 is established to be 4-14 μm, and that of the high molecular pillar 170 to be 15-45 μm.

The protrusion 160 and the high molecular pillar 170 then go through hard baking for 40 minutes at a suitable temperature such that they bear a predetermined strength. The height of the protrusion 160 and the high molecular pillar 170 is altered depending upon the high baking temperature. The hard baking temperature is preferably established to be 200-240° C.

The pattern width and the hard baking temperature suitable for obtaining the desired height of the protrusion and the high molecular pillar are established in accordance with the experimental data and the mathematical formulae 1, 2 and 3 to be described later.

Then, the combination of the thin film transistor array substrate and the color filter substrate is made through the following steps.

A sealer is coated onto the periphery of the color filter substrate, and the color filter substrate and the thin film transistor array substrate are arranged in an appropriate manner. The two substrates are heat-treated, and compressed against each other to attach together.

A liquid crystal material is injected between the two substrates.

The liquid crystal injection state of the liquid crystal display cell is tested, and only good quality products are selected. Polarizing plates are attached to the liquid crystal cell to thereby complete a liquid crystal display.

The reason that the protrusion and the high molecular pillar different heights can be formed through controlling the pattern width and the hard baking temperature will be now explained with reference to FIGS. 24 through 28.

Figure 24:
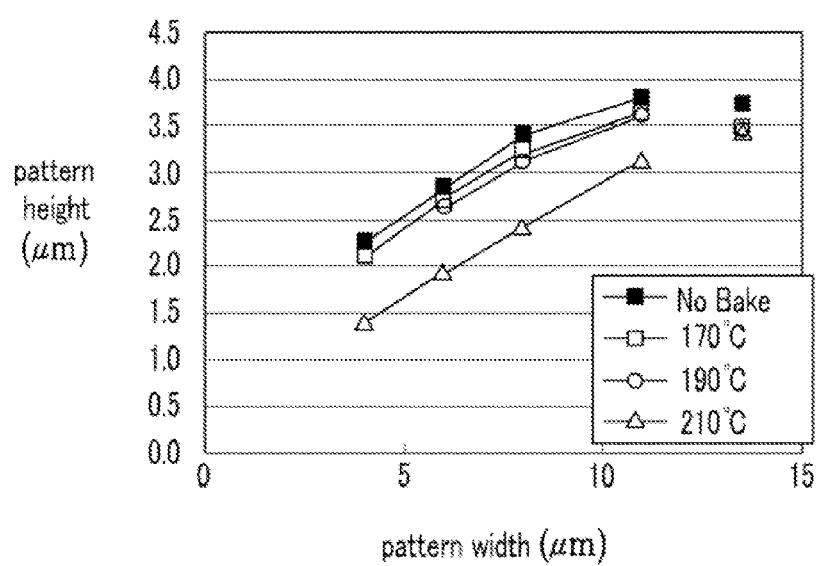
FIG. 24 is a graph illustrating the variation in height of a photosensitive resin pattern remaining after the photolithography process as a function of pattern width and hard baking temperature.

FIG. 24 is a graph illustrating the variation in height of the remaining photosensitive resin pattern after the photolithography process as a function of the pattern width and the hard baking temperature.

It is known from the graph of FIG. 24 that the narrower the pattern width is, the lower the remaining photosensitive resin pattern height becomes.

This also relates to the resolution of the light exposing device. If the pattern width of the mask becomes smaller than the resolution of the light exposing device, the less intense light enters the regions of the photosensitive resin intercepted by the mask due to the resolution of light so that the thickness of the photosensitive resin remaining after the development becomes smaller than the initial thickness.

Therefore, when the pattern width of the mask corresponding to the protrusion becomes narrower and the pattern width of the mask corresponding to the high molecular pillar becomes wider, the thickness of the photosensitive resin sided with the pattern width smaller than the resolution of the light exposing device becomes smaller than the initial thickness. In this way, the protrusion and the high molecular pillar of different heights can be formed in a simultaneous manner.

Meanwhile, when the photosensitive resin pattern goes through hard baking at 200° C. or more, the height of the remaining photosensitive resin pattern becomes further decreased at the narrow pattern width to thereby obtain the desired protrusion height. As shown in FIG. 24, the pattern width of 4 μm and hard-baked at 200° C., can obtain the height of 1.3 μm suitable for the protrusion. Furthermore, the pattern width is established to be 15 μm or more with the above conditions, can obtain the height of 3.0-3.5 μm suitable for the high molecular pillar.

Figure 25:
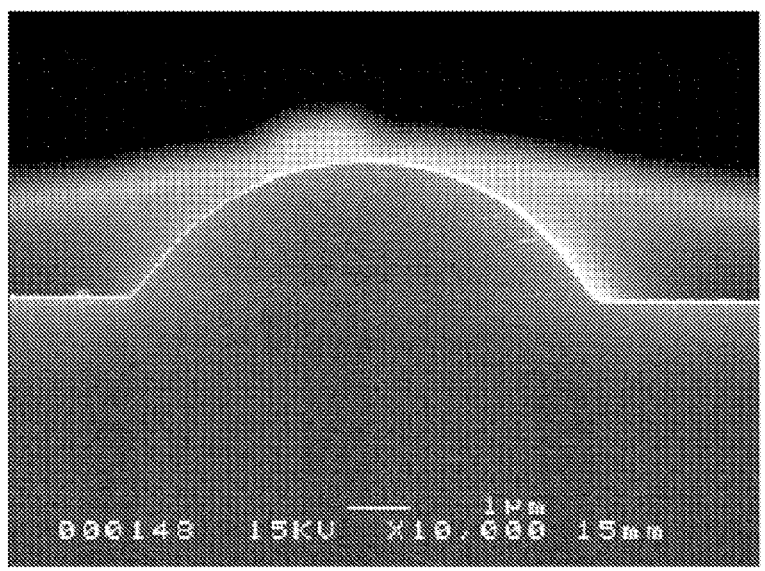
FIG. 25 is an electron microscope photograph of a photosensitive resin remaining after the photolithography process.
Figure 26:
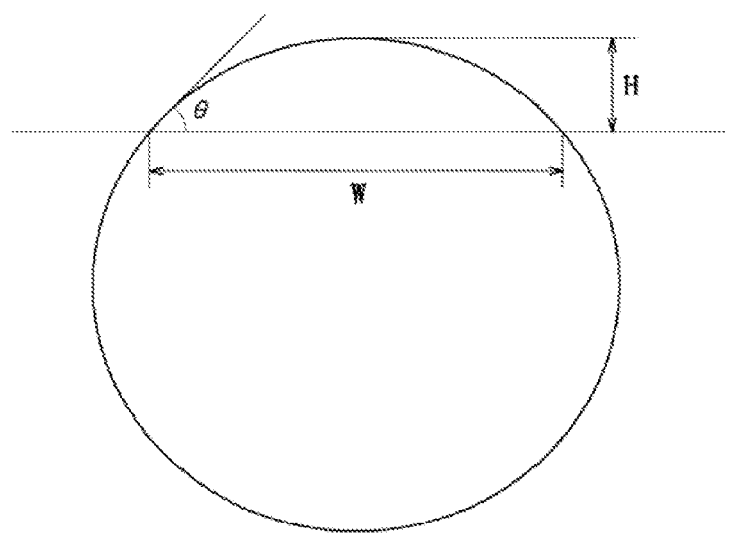
FIG. 26 is a conceptual view for mathematically inducing the sectional volume, width, and breadth of the photosensitive resin shown in FIG. 25.
Figure 27:
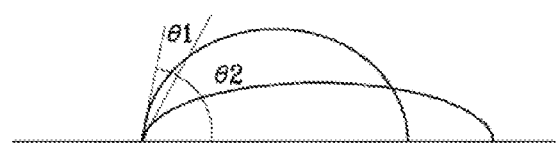
FIG. 27 is a conceptual view illustrating the sectional profile of a photosensitive resin after the hard baking process.
Figure 28:
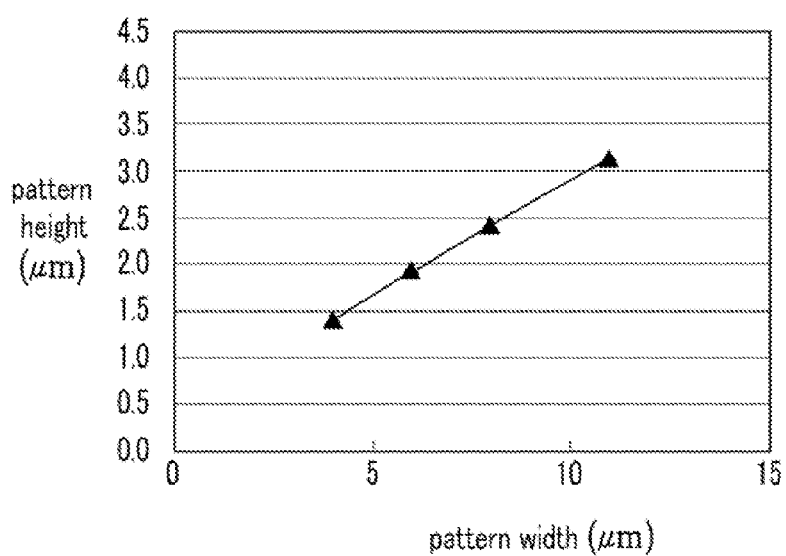
FIG. 28 is a graph illustrating the variation in height H of a photosensitive resin as a function of pattern width.

FIG. 25 is an electron microscope photograph of a photosensitive resin remaining after the photolithography process. FIG. 26 is a conceptual view for mathematically inducing the sectional volume, width, and breadth of the photosensitive resin shown in FIG. 25. FIG. 27 is a conceptual view illustrating the sectional profile of a photosensitive resin after the hard baking process. FIG. 28 is a graph illustrating the variation in height H of a photosensitive resin as a function of pattern width.

As known from the photograph of FIG. 25, the remaining photosensitive resin has an arc shape. From FIGS. 25 and 26, the following mathematical formulas can be induced.

$$H/W=(1-\cos \theta)/(2 \sin \theta) \quad (1)$$

$$W/\sqrt{A}=(2 \sin \theta)/\sqrt{(\theta-\sin \theta \cos \theta)} \quad (2)$$

$$H/\sqrt{A}=(1-\cos \theta)/\sqrt{(\theta \sin \theta \cos \theta)} \quad (3)$$

$$\theta=\cos^{-1}[\{(W/2)^2-H^2\}/\{(W/2)^2+H^2\}] \quad (4)$$

In the above mathematical formulae 1, 2, 3 and 4, θ is the taper angle of the photosensitive resin as a function of the hard baking temperature, H is the height of the photosensitive resin, W is the pattern width of the photosensitive resin related to the resolution, and A is the sectional volume of the photosensitive resin.

Meanwhile, if the photosensitive resin is hard-baked after the light exposure and the development, the height of the remaining photosensitive resin becomes further lowered. This can be confirmed at the graph of FIG. 24, and expressed as the variation in θ that is dependent upon the hard baking temperature, as shown in FIG. 27. In the drawing, θ1 is the section of the photosensitive resin before the hard baking, and θ2 is the section of the photosensitive resin after the hard baking at a suitable temperature. That is, the section of the photosensitive resin remaining after the hard baking is altered from θ1 to θ2 while changing the pattern height.

Assuming that the value of θ is the same at a predetermined hard baking temperature, the variation in height H of the photosensitive resin as a function of pattern width W at the respective values of θ is applied to the mathematical formulas. The results are illustrated in the graph of FIG. 28.

This agrees to the experimental results illustrated in the graph of FIG. 24.

It can be known from the above mathematical formulas that when two factors among the height, width, sectional volume, and taper angle of the photosensitive resin are determined, the other two factors can be automatically determined. Therefore, the desired height of photosensitive resin can be determined using the above mathematical formulas.

In the structure according to the fifth preferred embodiment, the protrusion pattern for the domain partitioning and the high molecular pillars for the cell gap fixation can be formed through one mask while reducing the number of relevant processing steps and increasing the productivity.

Figure 29:
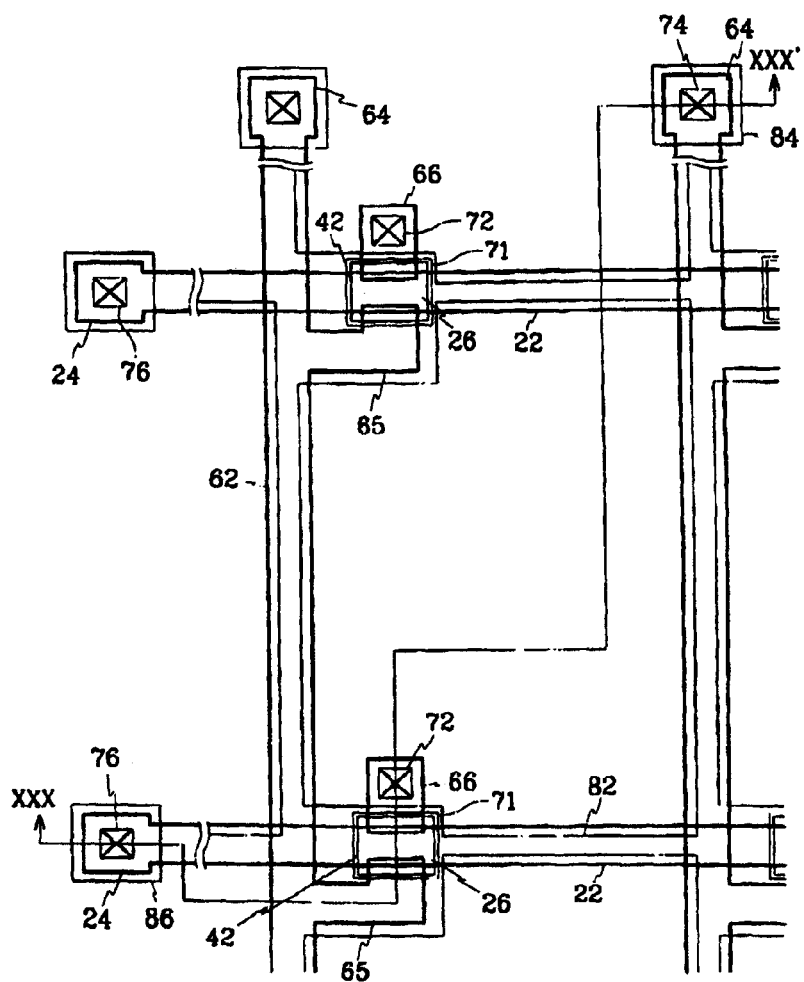
FIG. 29 is a plan view of a thin film transistor array substrate for a liquid crystal display according to a sixth preferred embodiment of the present invention.
Figure 30:
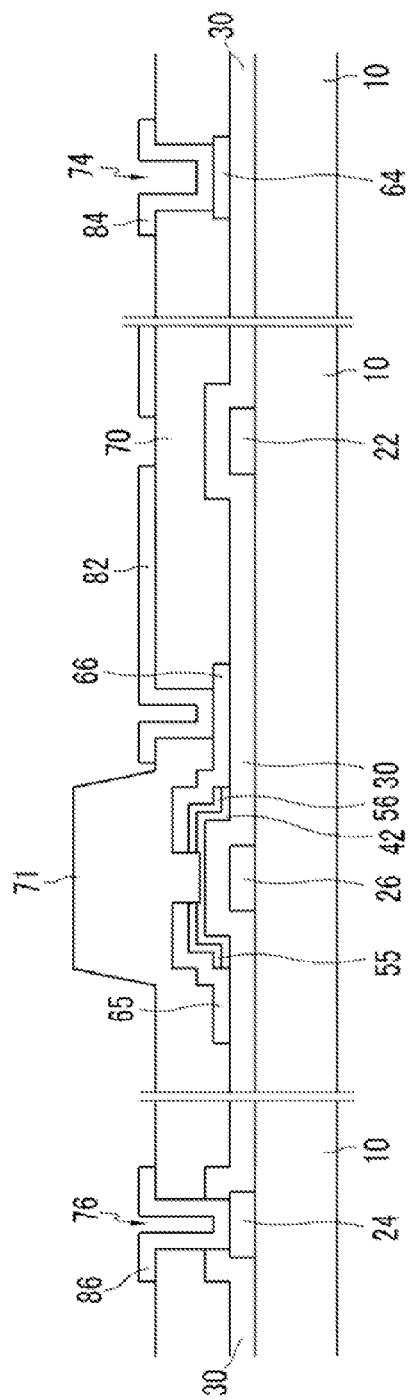
FIG. 30 is a cross sectional view of the thin film transistor array substrate taken along the XXX-XXX' line of FIG. 29.

FIG. 29 is a plan view of a thin film transistor array substrate for a liquid crystal display according to a sixth preferred embodiment of the present invention. FIG. 30 is a cross sectional view of the thin film transistor array substrate taken along the XXX-XXX' line of FIG. 29.

A gate line assembly is formed on an insulating substrate 10 with a low resistance metallic material based on aluminum, molybdenum, chrome or titanium. The gate line assembly includes gate lines 22 proceeding in the horizontal direction, gate pads 24 connected to ends of the gate lines 22 to receive gate signals from the outside and transmit them to the gate lines, and gate electrodes 26 connected to the gate lines 22 while forming thin film transistors.

The gate line assembly may be formed with a single or multiple-layered structure. When the gate line assembly is formed with a double-layered structure, at least one layer is preferably formed with a metallic material bearing a low resistance characteristic.

A gate insulating layer 30 is formed on the insulating substrate 10 of silicon nitride while covering the gate line assembly.

A semiconductor pattern 42 is formed on the gate insulating layer 30 with amorphous silicon while being overlapped with the gate electrodes 26. Ohmic contact patterns 55 and 56 are formed on the semiconductor pattern 42 with amorphous silicon where n type impurities are doped at high concentration.

A data line assembly is formed on the ohmic contact patterns 55 and 56 and the gate insulating layer 30 with a metallic material bearing good contact characteristic with respect to the semiconductor layer and low resistance characteristic such as molybdenum and molybdenum alloy.

The data line assembly includes data lines 62 proceeding in the vertical direction, data pads 64 connected to ends of the data lines 62 to receive data signals from the outside and transmit them to the data lines 62, source electrodes 65 protruded from the data lines 62 while contacting one side of ohmic contact pattern 55, and drain electrodes 66 facing the source electrodes 65 while contacting the Other side of ohmic contact pattern 56. The source and the drain electrodes 65 and 66 construct the thin film transistors in association with the gate electrodes 26.

An organic insulating pattern 70 is formed on the entire surface of the substrate 10 with the data line assembly as a protective layer based on an organic insulating material such as acrylic resin and benzocyclobutene (BCB). The organic insulating pattern 70 has spacers 71 protruded from the thin film transistors by the height of 4.5-5.5 µm, first contact holes 72 partially exposing the drain electrodes 66, second contact holes 74 exposing the data pads 64, and third contact holes 76 exposing the gate pads 24 together with the gate insulating layer 30. Except for the above components, the organic insulating pattern 70 are evenly formed at the entire surface of the substrate 10 by the height of 2-3 µm.

Pixel electrodes 82, subsidiary data pads 84, and subsidiary gate pads 86 are formed on the protective layer 70 with IZO or ITO. The pixel electrodes 82 are electrically connected to the drain electrodes 66 through the first contact holes 72 to receive picture signals from the data lines 62. The subsidiary gate and data pads 84 and 86 are electrically connected to the gate and data pads 24 and 64 through the second and third contact holes 74 and 76.

A method for fabricating the thin film transistor array substrate will be now explained with reference to FIGS. 31A, 31B, 32A, 32B, 33A, 33B, 34A, 34B and 35.

Figure 31A:
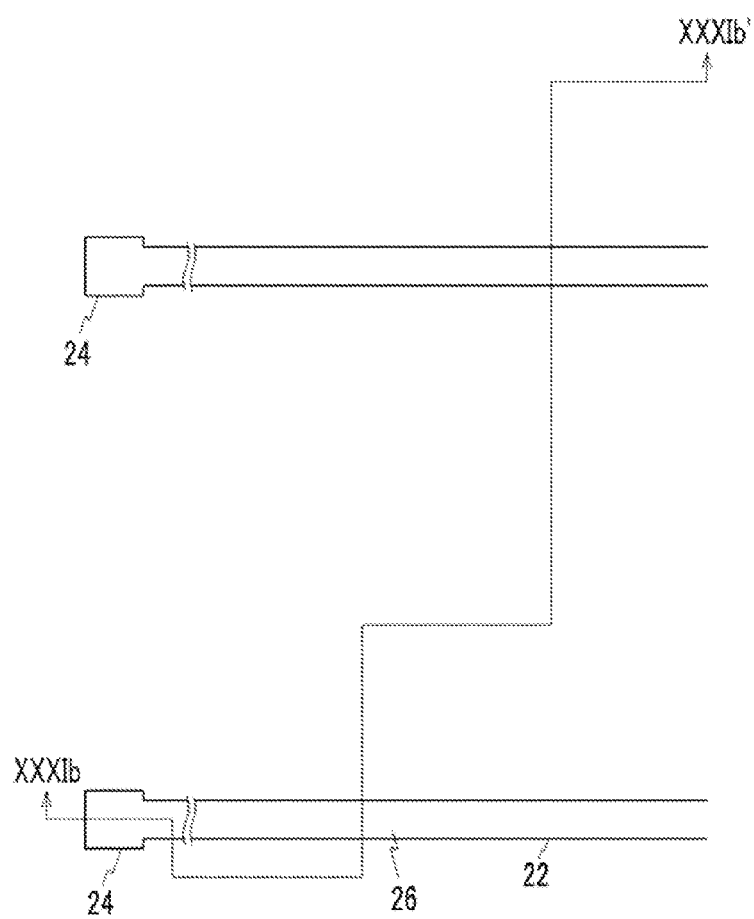

As shown in FIGS. 31A and 31B, an aluminum-based layer having a low resistance characteristic is deposited onto a substrate 10, and patterned through photolithography to thereby form a gate line assembly. The gate line assembly includes gate lines 22, gate pads 24, and gate electrodes 26.

Figure 32A:
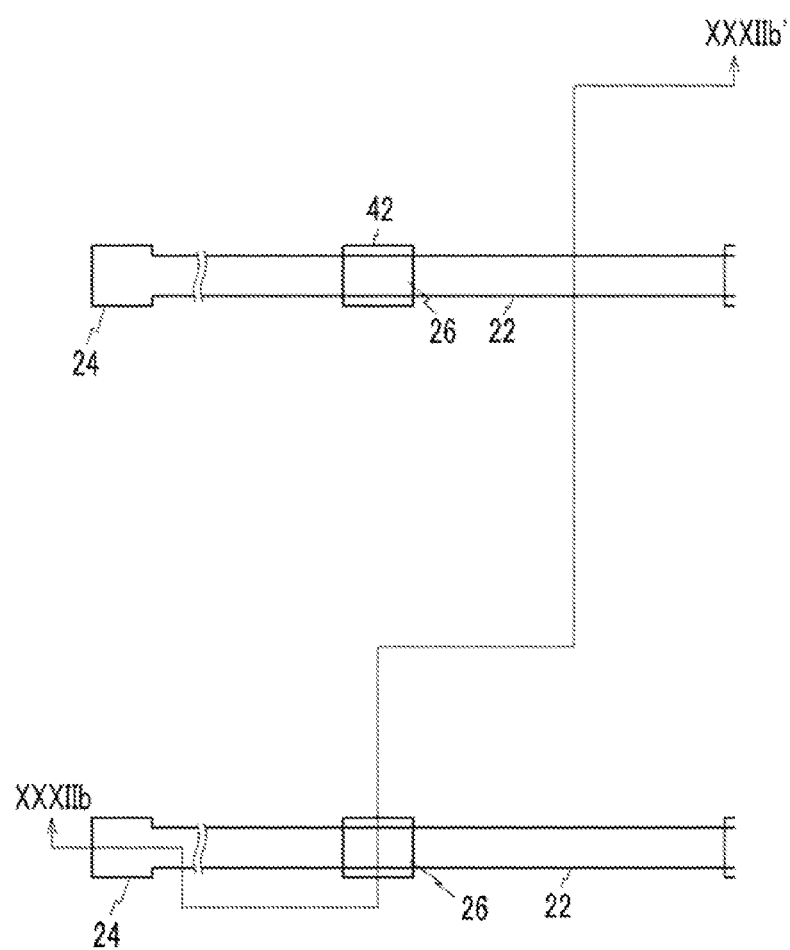
Figure 32B:
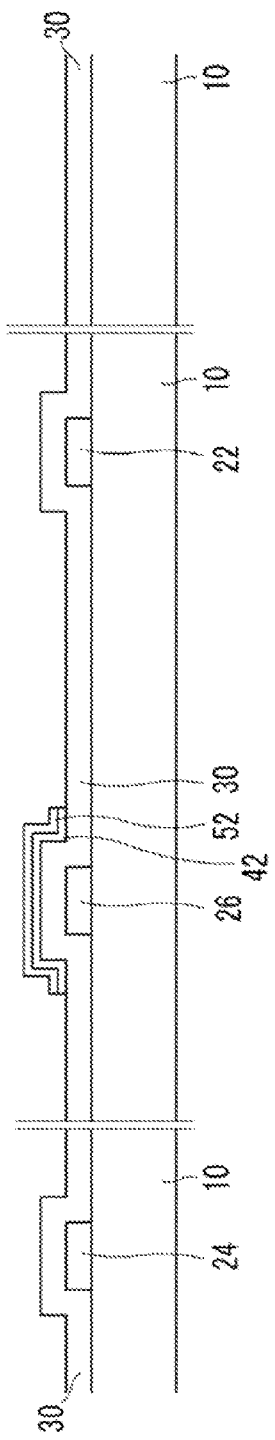

Thereafter, as shown in FIGS. 32A and 32B, a gate insulating layer 30 is deposited onto the substrate 10 with silicon nitride such that it covers the gate line assembly.

A semiconductor layer and an impurities-doped semiconductor layer are sequentially deposited onto the gate insulating layer 30, and patterned through photolithography to thereby form an ohmic contact pattern 52 and a semiconductor pattern 42.

Figure 33A:
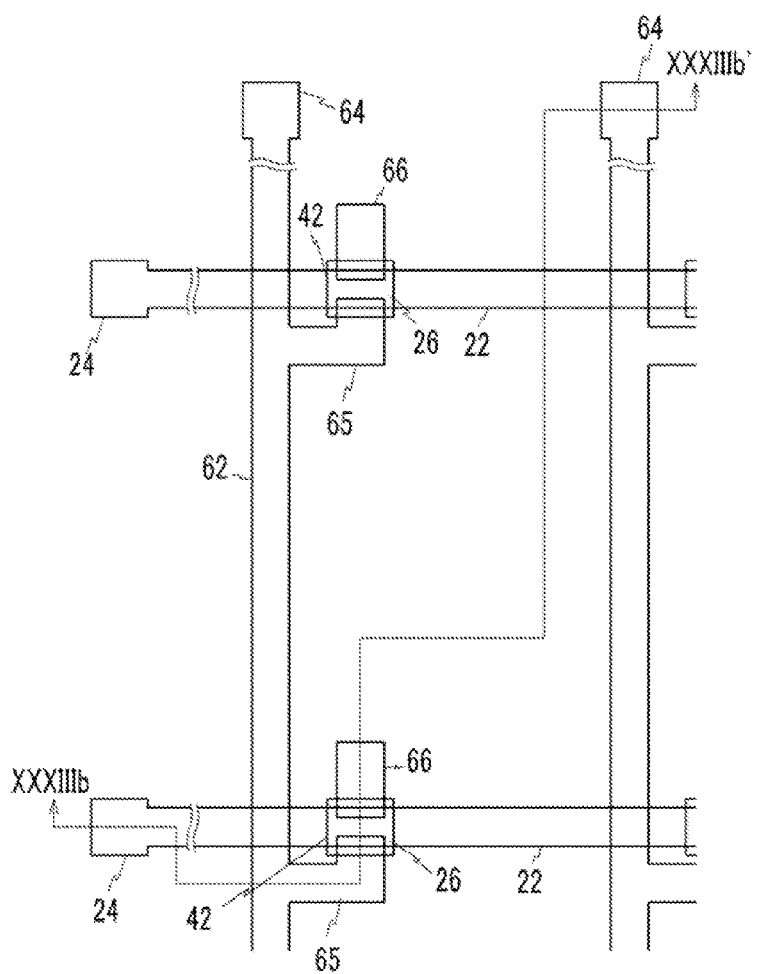
Figure 33B:
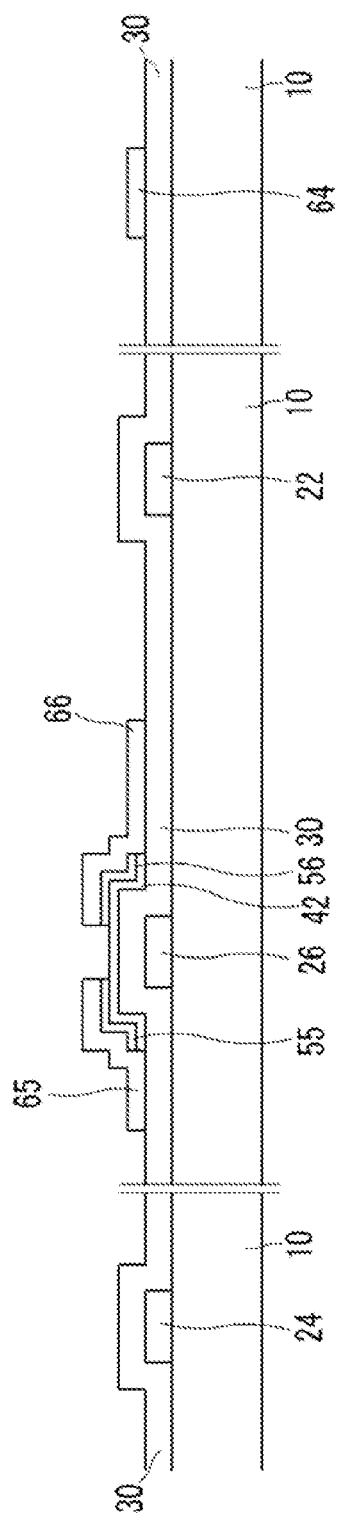

As shown in FIGS. 33A and 33B, a molybdenum-based layer bearing a good contact characteristic with respect to the semiconductor layer and a low resistance characteristic is deposited onto the entire surface of the substrate 10, and patterned through photolithography to thereby form a data line assembly. The data line assembly includes data lines 62, data pads 64, source electrodes 65, and drain electrodes 66.

The island-shaped ohmic contact pattern 52 is etched using the source and the drain electrodes 65 and 66 as a mask to thereby form an ohmic contact pattern 55 contacting the source electrodes 65, and an ohmic contact pattern contacting the drain electrodes 66.

Figure 34A:
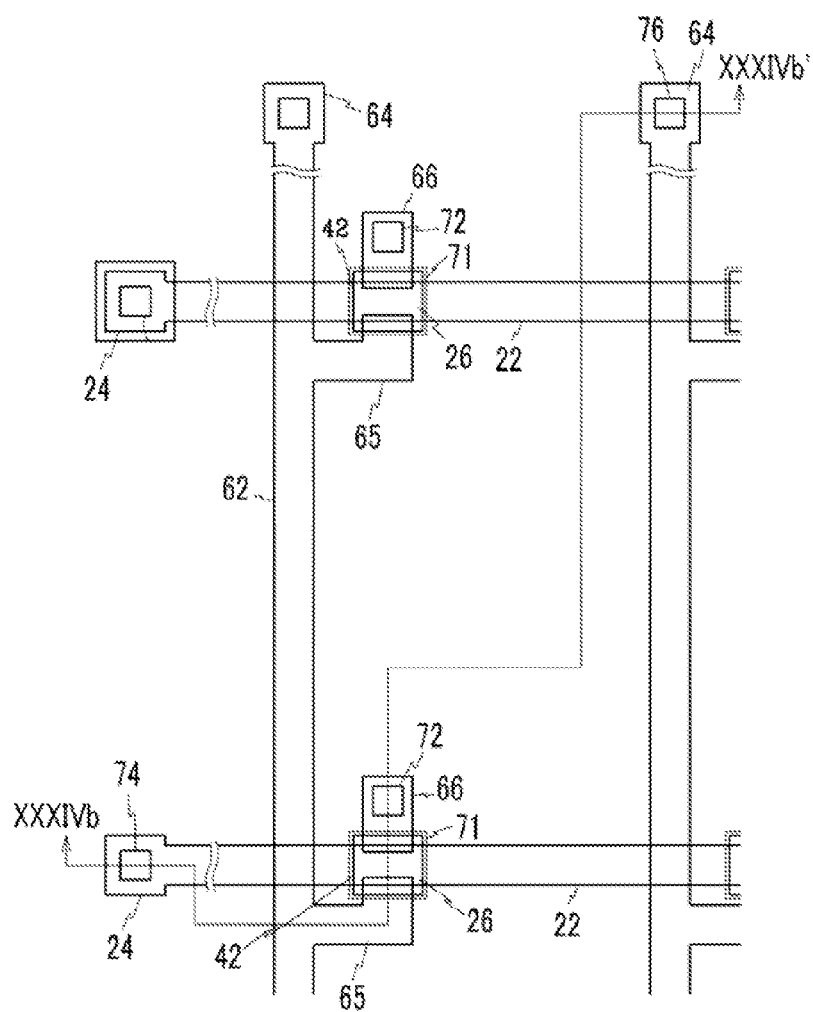
Figure 34B:
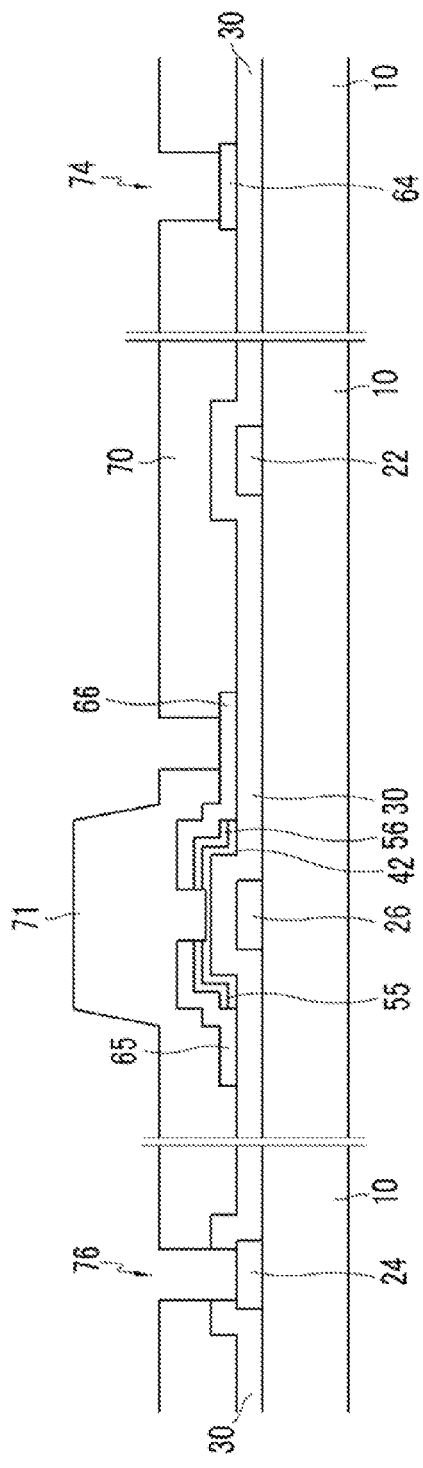
Figure 35:
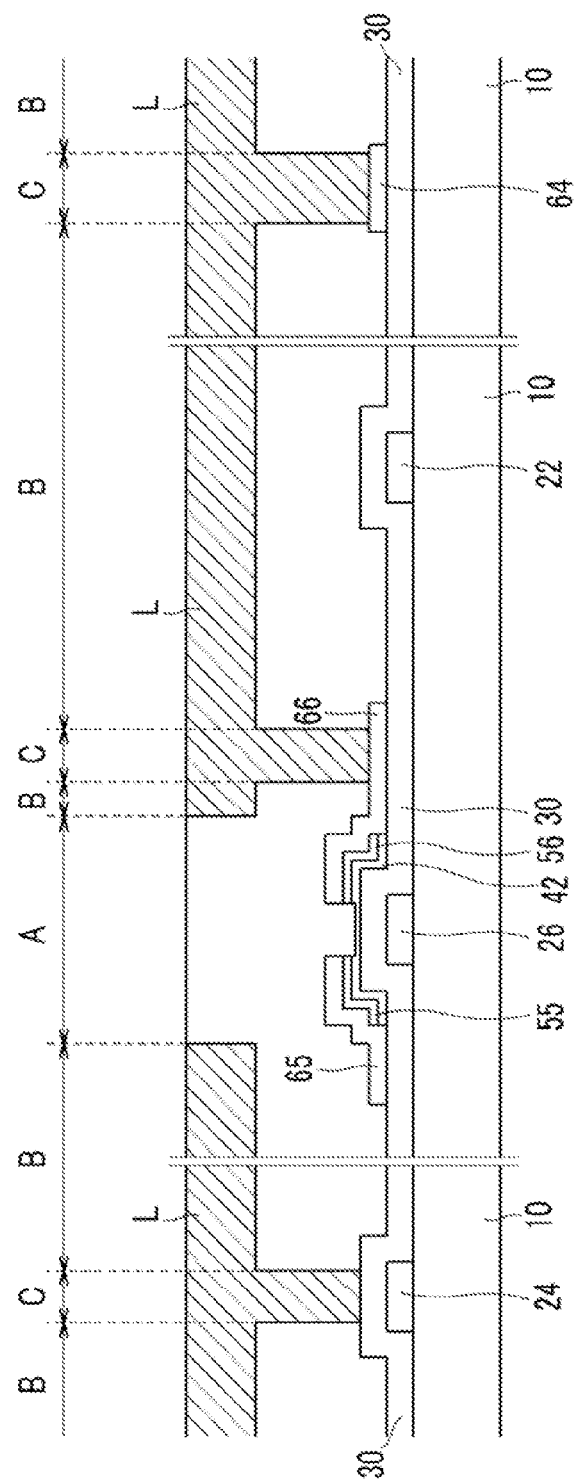

As shown in FIGS. 34A and 34B, an organic insulating pattern 70 is formed on the entire surface of the substrate 10 such that it has spacers 71 protruded from the thin film transistors, first contact holes 72 partially exposing the drain electrodes 66, second contact holes 74 exposing the data pads 64, and third contact holes 76 contacting the gate pads together with the gate insulating layer 30.

The organic insulating pattern 70 can be formed through one photolithography process using one mask. This technique will be now explained with reference to FIG. 35.

An organic insulating layer L is deposited onto the entire surface of the substrate 10 with a photosensitive organic insulating material. The photosensitive organic insulating material can be produced through mixing a photosensitive material with an organic insulating material such as acrylic resin and BCB.

The photosensitive organic insulating layer L is exposed to light through a mask (not shown) having different light transmission. At this time, a mask bearing a slit or lattice pattern or a semitransparent film is used to control the light transmission. It is preferable that the pattern width should be smaller than the light decomposition capacity of the light exposing device. In the case of a semitransparent film, thin films of different light transmission or different thickness can be used to control the light transmission.

In the photosensitive organic insulating layer L, the mask region entirely exposed to light is placed at the area C where the first contact hole 72, the second contact hole 74 and the third contact holes 76 are formed. The mask region entirely blocked from the light is placed at the area A where the spacers 71 are formed. The slit pattern or the semitransparent film of the mask is placed at the remaining B area.

When the photosensitive organic insulating layer L is exposed to light through such a mask, the high molecules at the C area are completely decomposed, those at the B area are decomposed by a predetermined thickness (for example, by half the thickness of the organic insulating layer), and those at the A area are not nearly decomposed. If the light exposure is too long, all of the molecules are liable to be decomposed.

Instead of one mask, two masks may be used to expose the organic insulating layer to light in a double manner.

For this purpose, the portions of the organic insulating layer at the C area of the first, second and third contact holes 72, 74 and 76 are exposed to light through a first mask, and the portions of the organic insulating layer at the B and C areas except for the A area where the spacers 71 are formed are exposed to light through a second mask. Then, the light-exposed organic insulating layer is developed to thereby form an organic insulating pattern 70. It is preferable that the light exposure is preferably controlled at the light exposing based on the second mask to decompose the organic insulating layer only by a predetermined thickness.

When the selectively light-exposed organic insulating layer is developed, the portions where the polymers are not decomposed are left over, and the portions where the polymers are decomposed at some degree are partially left over. Consequently, as shown in FIG. 34B, an organic insulating pattern 70 is completed.

Of course, the organic insulating pattern 70 may be formed using a negative photosensitive organic insulating material where the light-exposed portions are left over. In this case, the region of the mask blocking light is placed at the C area where the first, second and third contact holes 72, 74 and 76 are formed, and the region of the mask transmitting light is placed at the A area where the spacers 71 are formed. The slit pattern or the semitransparent film of the mask is placed at the B area.

Thereafter, the gate insulating layer 30 is etched using the organic insulating pattern 70 as a mask to thereby form third contact holes 76 exposing the gate pads 24.

In order to heighten the light transmission of the organic insulating pattern 70, the step of hardening the organic insulating pattern 70 may be added.

As shown in FIGS. 29 and 30, an ITO or IZO-based layer is deposited onto the substrate 10 with the organic insulating pattern 70, and patterned through photolithography to thereby form pixel electrodes 82 contacting the drain electrodes 66 through the first contact holes 72, and subsidiary gate and data pads 86 and 84 contacting the gate and data pads 24 and 64 through the second and third contact holes 76 and 74.

The subsequent processing steps are then made to thereby complete a thin film transistor array substrate.

As described above, in the thin film transistor array substrate according to the sixth preferred embodiment, the spacers are made during the photolithography process for forming the contact holes at the organic insulating layer without separate processing steps, and this simplifies the relevant processing steps.

Figure 36:
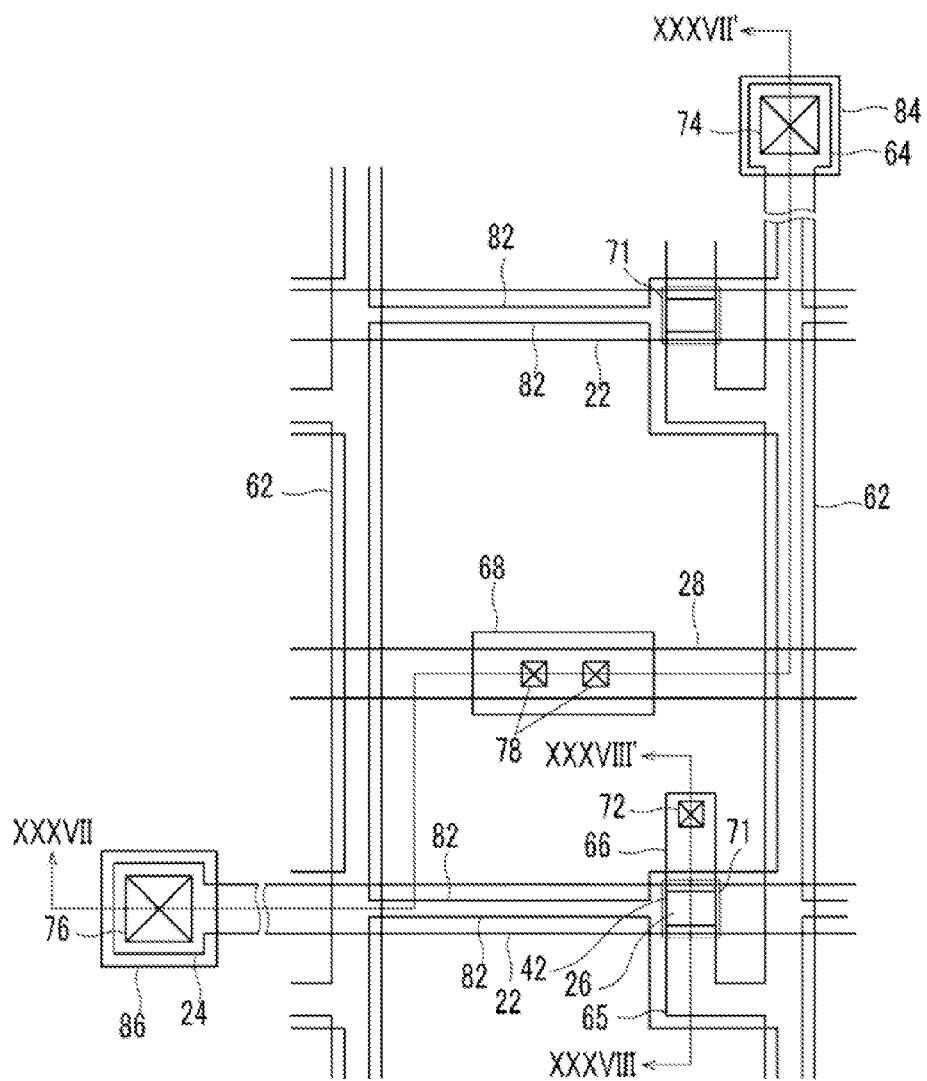
FIG. 36 is a plan view of a thin film transistor array substrate for a liquid crystal display according to a seventh preferred embodiment of the present invention.

FIG. 36 is a plan view of a thin film transistor array substrate according to a seventh preferred embodiment of the present invention, and FIGS. 37 and 38 are cross sectional views of the thin film transistor array substrate taken along the XXXVII-XXXVII' line and the XXXVIII-XXXVIII' of FIG. 36.

A gate line assembly is formed on an insulating substrate 10 with a low resistance metallic material such as aluminum, molybdenum, chrome and titanium. The gate line assembly includes gate lines 22 proceeding in the horizontal direction, gate pads 24 connected to ends of the gate lines 22 to receive gate signals from outside and transmit them to the gate lines 22, and gate electrodes 26 connected to the gate lines 22. Storage capacitor electrodes 28 are arranged parallel to the gate lines 22.

The storage capacitor electrodes 28 overlap storage capacitor conductive patterns 68 connected to pixel electrodes 82 to be described later to thereby form storage capacitors. The storage capacitors enhance the electric potential storage capacity of the pixels. In case sufficient storage capacity is obtained through the overlapping of the pixel electrodes 82 and the gate lines, the storage capacitor electrodes 28 may be omitted.

The gate line assembly may be formed with a single or multiple-layered structure. In case the gate line assembly is formed with a double-layered structure, at least one layer is preferably formed with a low resistance metallic material.

A gate insulating layer 30 is formed on the insulating substrate 10 with an insulating material such as silicon nitride while covering the gate line assembly.

Semiconductor patterns 42 and 48 are formed on the gate insulating layer 30 with a semiconductor material such as amorphous silicon, and ohmic contact patterns 55, 56 and 58 are formed on the semiconductor patterns 42 and 48 with amorphous silicon where impurities are doped.

A data line assembly is formed on the ohmic contact patterns 55, 56 and 58 with a low resistance metallic material bearing good contact characteristic with the semiconductor layer, such as molybdenum.

The data line assembly includes data lines 62 proceeding in the horizontal direction while crossing over the gate lines 22, data pads 64 connected to ends of the data lines 62 to receive data signals from the outside and transmit them to the data lines 62, source electrodes 65 protruded from the data lines 62 while contacting one side of the ohmic contact pattern 55, and drain electrodes 66 facing the source electrodes 65 while contacting the other side of the ohmic contact pattern 56. Storage capacitor conductive patterns 68 are placed over the storage capacitor electrodes 28.

The semiconductor patterns 42 and 48 include a thin film transistor semiconductor pattern 42, and a storage capacitor semiconductor pattern 48. The semiconductor patterns 42 and 48 have the same shape as the data line assembly and the ohmic contact patterns 55, 56 and 58 except for the channel region between the source and the drain electrodes 65 and 66. That is, the storage capacitor semiconductor pattern 48 has the same shape as the storage capacitor conductive pattern 68 and the storage capacitor ohmic contact pattern 58. The thin film transistor semiconductor pattern 42 has the same shape as the data lines 62, the data pads 64, and the source and drain electrodes 65 and 66 except that it further includes the channel portion between the source and the drain electrodes 65 and 66.

The ohmic contact patterns 55, 56 and 58 lower the contact resistance between the underlying semiconductor patterns 42 and 48 and the overlying data line assembly while bearing the same shape as the data line assembly. The first ohmic contact pattern 55 contacts the data lines 62, the data pads 64 and the source electrodes 65, the second ohmic contact pattern 56 contacts the drain electrodes 66, and the third ohmic contact pattern 58 contacts the storage capacitor conductive pattern 68.

An organic insulating pattern 70 is formed on the entire surface of the substrate 10 with the data line assembly of an organic insulating material such as acrylic resin and BCB. The organic insulating pattern 70 has spacers 71 protruded from the thin film transistors by the height of 4.5-5.5 µm, first contact holes partially exposing the drain electrodes 66, second contact holes 74 exposing the data pads 64, third contact holes 76 exposing the gate pads 24 together with the gate insulating layer 30, and fourth contact holes exposing the storage capacitor conductive pattern 68. Except for the above components, the organic insulating pattern 70 is evenly formed on the entire surface of the substrate 10 by the height of 2-3 µm.

Pixel electrodes 82, and subsidiary gate and data pads 86 and 84 are formed on the organic insulating pattern 70 with IZO or ITO. The pixel electrodes 82 contact the drain electrodes 66 and the storage capacitor conductive pattern 68 through the first and fourth contact holes 72 and 78. The subsidiary gate and data pads 86 and 84 contact the gate and data pads 24 and 64 through the second and third contact holes 74 and 76.

A method for fabricating the thin film transistor array substrate will be now explained with reference to FIGS. 39A through 47B.

Figure 39A:
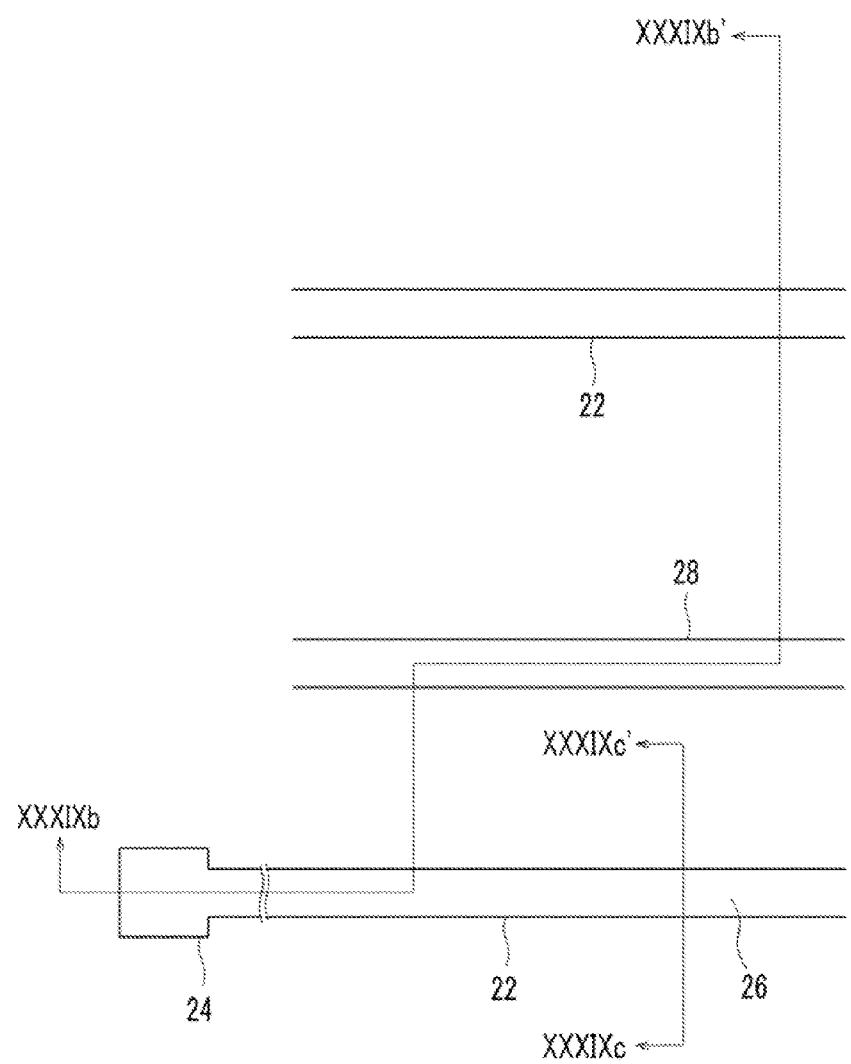

As shown in FIGS. 39A, 39B and 39C, an aluminum-based layer bearing a low resistance is deposited onto a substrate 10, and patterned through photolithography to thereby form a gate line assembly. The gate line assembly includes gate lines 22, gate pads 24, gate electrodes, and a storage capacitor conductive pattern 28.

A gate insulating layer 30 is deposited onto the substrate 10 with an insulating material such as silicon nitride while covering the gate line assembly.

Figure 40A:
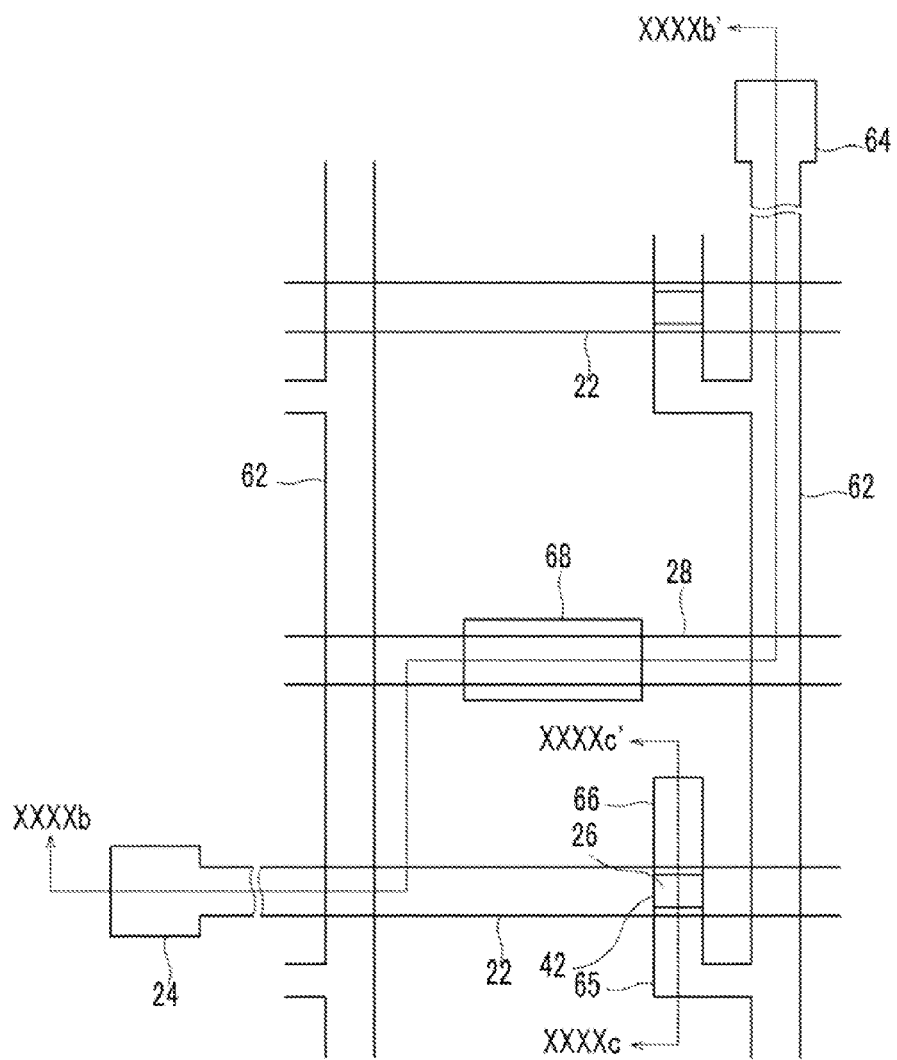
Figure 40B:
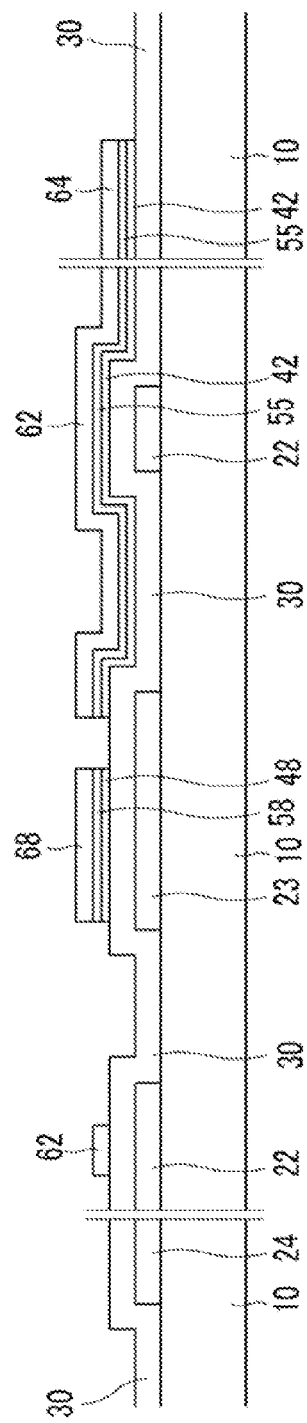
Figure 40C:
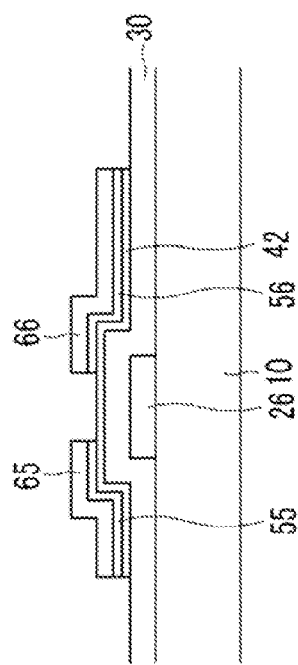

As shown in FIGS. 40A, 40B and 40C, a semiconductor layer, an impurities-doped semiconductor layer and a metallic layer are sequentially deposited onto the gate insulating layer, and patterned through photolithography to thereby form semiconductor patterns 42 and 48, ohmic contact patterns 55, 56 and 58, and a data line assembly. The data line assembly includes data lines 62, data pads 64, source electrodes 65, drain electrodes 66, and storage capacitor electrodes 68. It is preferable that the metallic layer for the data line assembly is based on a low resistance metallic material bearing good contact characteristic with respect to the semiconductor layer such as molybdenum.

The data line assembly has the same outline as the underlying ohmic contact patterns 55, 56 and 58 that have in turn the same outline as the underlying semiconductor patterns 42 and 48 for the thin film transistors and the storage capacitors. The thin film transistor semiconductor pattern 42 has the same shape as the data lines 62, the data pads 64, and the source and drain electrodes 65 and 66 except that it further has the channel portion between the source and the drain electrodes 65 and 66.

The data line assembly, the ohmic contact patterns 55, 56 and 58, and the semiconductor patterns 42 and 48 may be formed using only one mask. This technique will be now explained with reference to FIGS. 41A through 45B.

Figure 41A:
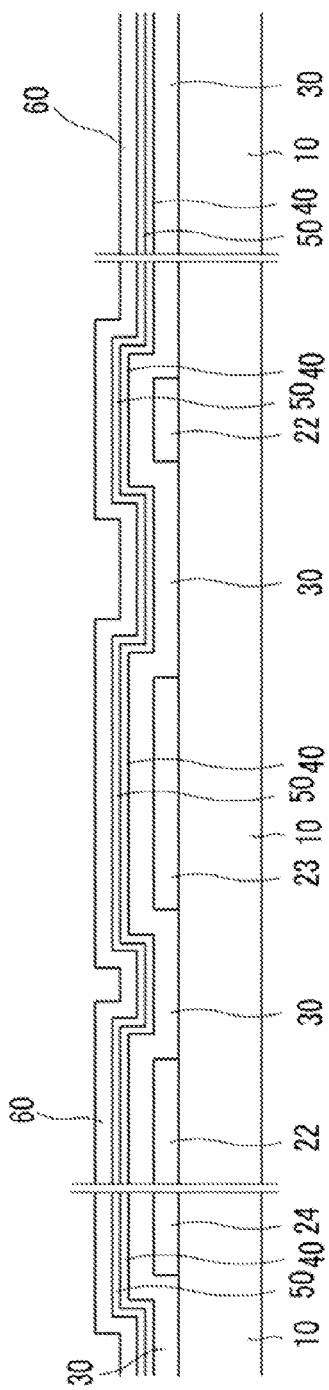
Figure 41B:
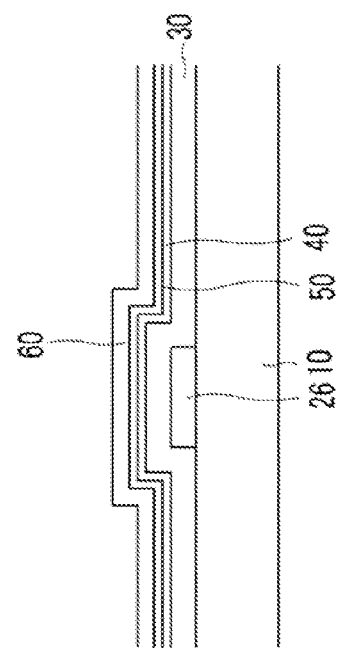

As shown in FIGS. 41A and 41B, a semiconductor layer 40, an impurities-doped semiconductor layer 50 are sequentially deposited onto the gate insulating layer 30 through chemical vapor deposition, and subsequently, a metallic layer 60 is deposited onto the impurities-doped semiconductor layer 50.

Thereafter, as shown in FIGS. 42A and 42B, a photoresist film is coated onto the metallic layer 60. The photoresist film is exposed to light through a mask (not shown), and developed to thereby form first and second photoresist patterns 112 and 114. The first photoresist pattern 112 is placed at the data line area A, and the second photoresist pattern 114 is placed at the channel area C between the source and the drain electrodes 65 and 66. The photoresist film at the remaining area B is all removed. The first photoresist pattern 112 has a thickness larger than the second photoresist pattern 114. The thickness ratio of the second photoresist pattern 114 to the first photoresist pattern 112 should be determined depending upon the processing conditions at the subsequent etching. The thickness ratio is preferably established to be 1/2.

The photoresist pattern of different thickness is formed using a mask of different light transmission. In order to control the light transmission, the mask is provided with a slit or lattice pattern or a semitransparent film. It is preferable that the pattern width should be smaller than the decomposition capacity of the light exposing device. In the case of a semitransparent film, a thin film of different light transmission or thickness can be used.

The photoresist film is exposed to light through such a mask, the high molecules at the area C directly exposed to light are completely decomposed, those at the area B corresponding to the slit pattern or the semitransparent film are decomposed at some degree, and those at the area A blocked from the light are not nearly decomposed. If the light exposure is too long, all of the molecules are liable to be decomposed.

When the selectively light-exposed photoresist film is developed, the portions where the molecules are not decomposed are left over so that the thickness of the photoresist pattern blocked from light is different from the portions partially exposed to light.

Figure 43A:
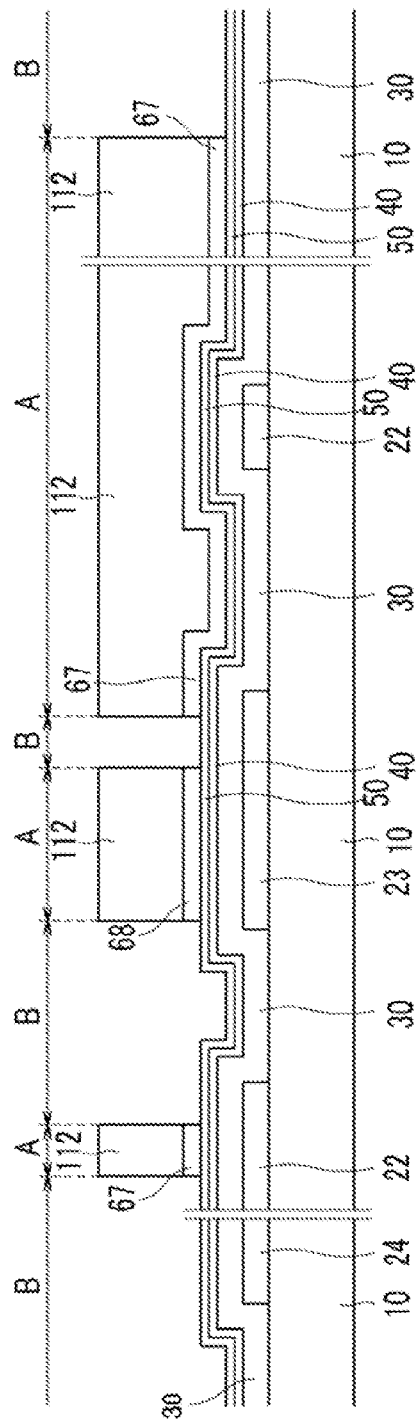
Figure 43B:
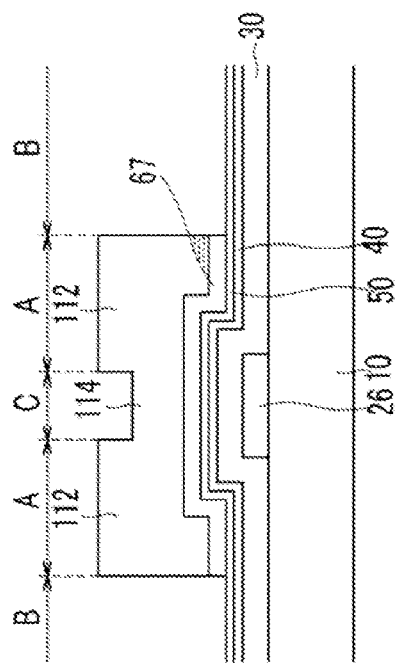

As shown in FIGS. 43A and 43B, the metallic layer 60 at the B area is etched using the photoresist patterns 112 and 114 as a mask while exposing the underlying impurities-doped semiconductor layer 50.

Consequently, the metallic patterns 67 and 68 placed at the channel area C and the data line assembly area A are left over, and the metallic layer at the remaining area B is removed while exposing the underlying impurities-doped semiconductor layer 50. The metallic pattern 68 becomes a storage capacitor conductive pattern, and the metallic pattern 67 becomes a data line assembly where the source and the drain electrodes 65 and 66 are not yet separated.

Thereafter, as shown in FIGS. 44A and 44B, the impurities-doped semiconductor layer 50 at the B area and the underlying semiconductor layer 40 are simultaneously removed through dry etching together with the second photoresist pattern 114. At this time, the etching should be made in condition that the photoresist patterns 112 and 114, the impurities-doped semiconductor layer 50 and the semiconductor layer 40 are simultaneously etched while not etching the gate insulating layer 30. It is preferable that the etching ratios with respect to the photoresist patterns 112 and 114 and the semiconductor layer 40 are nearly the same. For instance, the two layers can be etched by nearly the same thickness using a mixture of $SF_6$ and HCl or a mixture of $SF_6$ and $O_2$ In case the etching ratios with respect to the photoresist patterns 112 and 114 and the semiconductor layer 40 are the same, the thickness of the second photoresist pattern 114 should be the same as or smaller than the sum in thickness of the semiconductor layer 40 and the impurities-doped semiconductor layer 50.

Consequently, the second photoresist pattern 114 at the channel area C is removed while exposing the underlying metallic pattern 67, and the impurities-doped semiconductor layer 50 and the semiconductor layer 40 at the B area are removed while exposing the underlying gate insulating layer 30. Meanwhile, the first photoresist pattern 112 at the data line assembly area A is also etched while being reduced in thickness.

In this process, the semiconductor patterns 42 and 48 for the thin film transistors and the storage capacitors are completed.

Furthermore, an ohmic contact pattern 57 is formed on the thin film transistor semiconductor pattern 42 with the same outline, and an ohmic contact pattern 58 is formed on the storage capacitor semiconductor pattern 48 with the same outline.

The second photoresist pattern remaining on the metallic pattern 67 at the channel area c is removed through ashing.

Figure 45A:
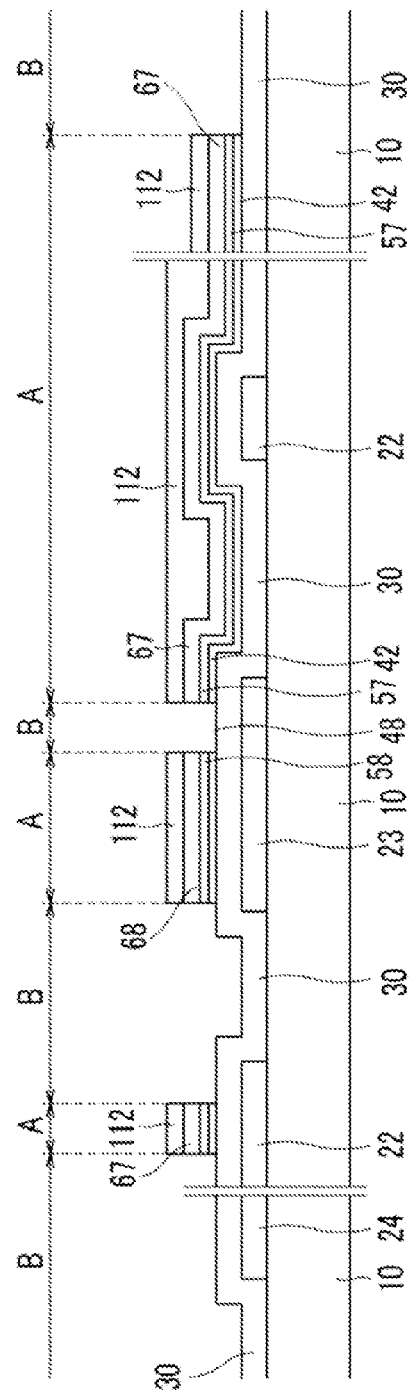
Figure 45B:
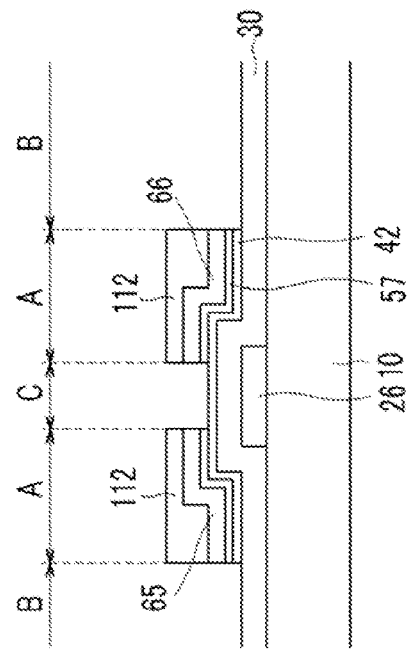

Thereafter, as shown in FIGS. 45A and 45B, the metallic pattern 67 at the channel area C and the underlying ohmic contact pattern 57 are etched using the first photoresist pattern 112 as a mask.

At this time, the semiconductor pattern 42 may be partially etched while being reduced in thickness. The first photoresist pattern 112 is also etched by a predetermined thickness. The etching should be made in condition that the gate insulating layer 30 is not etched. The thickness of the first photoresist pattern 112 is preferably so large as to prevent the underlying data line assembly from being exposed to the outside through the etching.

In this process, the source and the drain electrodes 65 and 66 are separated from each other. That is, the data lines 62, the source electrodes 65 and the drain electrodes 68 are completed together with the underlying ohmic contact patterns 55, 56 and 58.

Figure 46A:
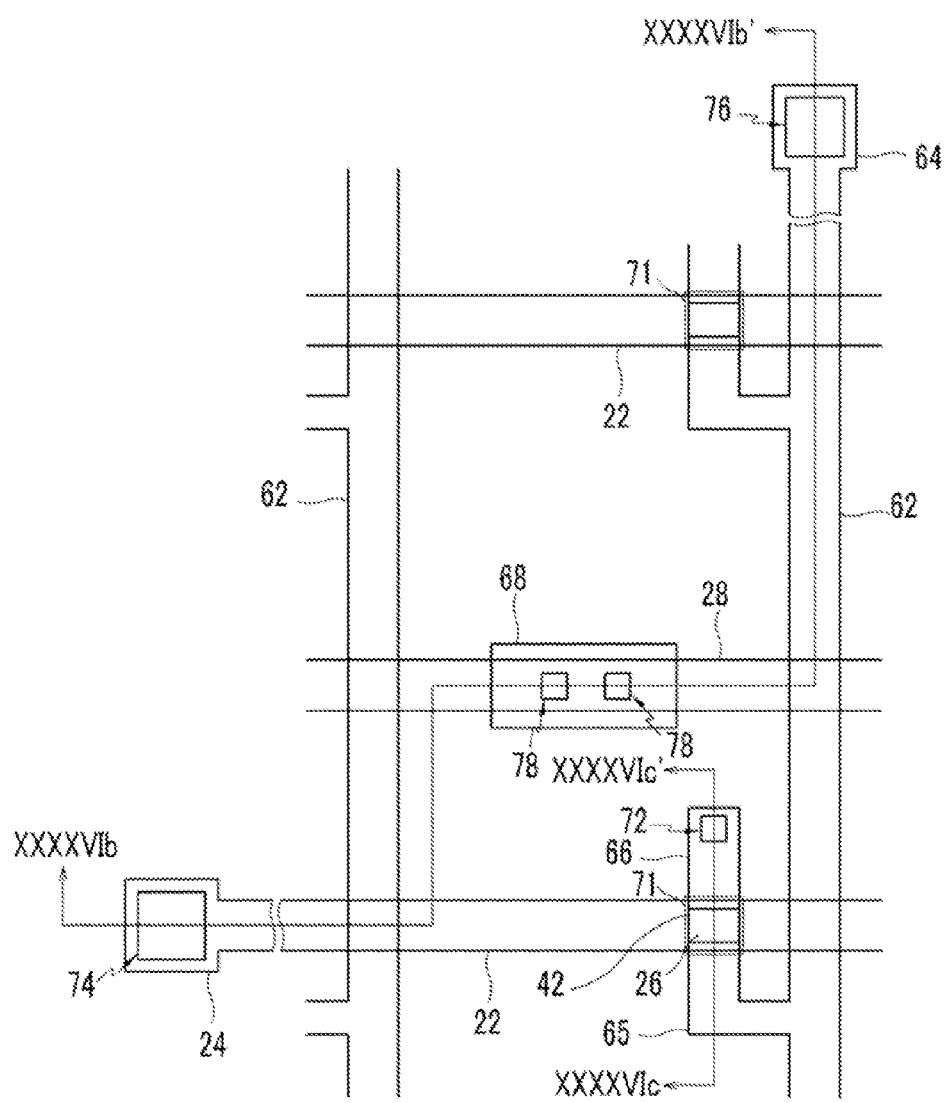
Figure 47A:
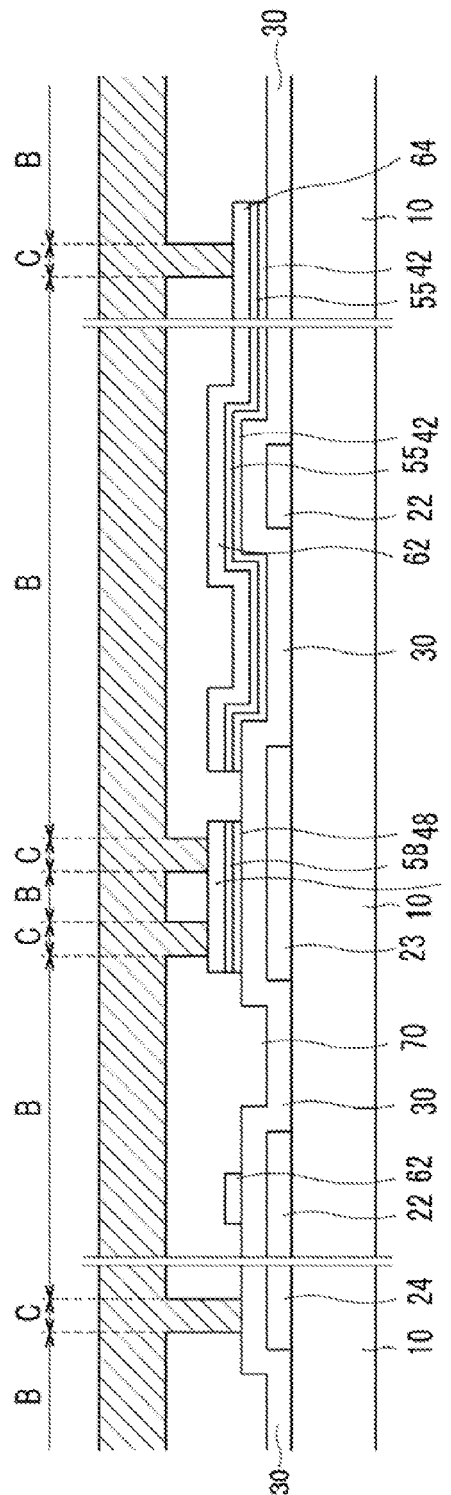
Figure 47B:
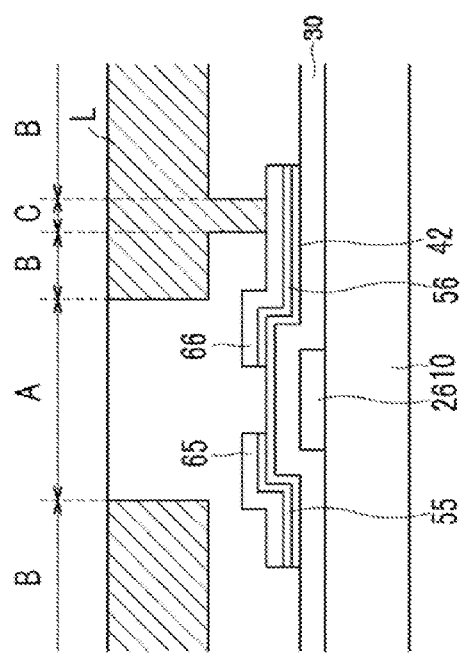

Thereafter, as shown in FIGS. 46A, 46B and 46C, the first photoresist pattern 112 remaining at the substrate 10 is removed through ashing.

An organic insulating pattern 70 is then formed on the entire surface of the substrate 10 such that it has spacers 71 protruded from the thin film transistors, first contact holes 72 partially exposing the drain electrodes 66, second contact holes 76 exposing the data pads 64, third contact holes 74 exposing the gate pads 24 together with the gate insulating layer 30, and fourth contact holes 78 exposing the storage capacitor conductive pattern 68.

The organic insulating pattern 70 may be formed through one photolithography process. This technique will be now explained with reference to FIGS. 47A and 47B.

An organic insulating layer L is deposited onto the entire surface of the substrate 10 with the data line assembly based on a photosensitive organic insulating material. The photosensitive organic insulating material can be prepared through mixing a photosensitive material with acrylic resin or BCB.

Thereafter, the photosensitive organic insulating layer L is selectively exposed to light through a mask (not shown) of different light transmission.

In the photosensitive organic insulating layer L, the region of the mask directly exposed to light is placed at the C area where the first through fourth contact holes 72, 74, 76 and 78 are formed, the region of the mask blocked from light is placed at the A area where the spacers 71 are formed, and the slit pattern or the semitransparent film of the mask is placed at the remaining B area.

When the photosensitive organic insulating layer L is exposed to light through such a mask, the molecules at the C area are completely decomposed, those at the B area are decomposed by a predetermined thickness, and those at the A area are barely decomposed. In case the light exposure is too long, all of the molecules are liable to be decomposed.

The light exposing with respect to the organic insulating layer may be made using two masks.

For this purpose, the portions of the organic insulating layer at the C area where the first through fourth contact holes are formed are exposed to light using a first mask, and the portions at the B and C areas except for the A area where the spacers 71 are formed are exposed to light using a second mask. The organic insulating layer is then developed to form an organic insulating pattern 70. The amount of light exposure should be controlled such that the organic insulating layer is not completely decomposed.

When the selectively light-exposed organic insulating layer is developed, only the portions thereof where the molecules are not decomposed are left over. Consequently, as shown in FIGS. 46B and 46C, the organic insulating pattern 70 of different thickness is completed.

Of course, the organic insulating pattern 70 may be formed using a negative photosensitive organic insulating material where the light-exposed portions are left over. In this case, the region of the mask intercepted from light is placed at the C area where the first through fourth contact holes 72, 74, 76 and 78 are formed, and the region of the mask exposed to light is placed at the A area where the spacers 71 are formed. The slit pattern or the semitransparent film of the mask is placed at the B area.

Thereafter, the gate insulating layer 30 is etched using the organic insulating pattern 70 as a mask to thereby form third contact holes 76 exposing the gate pads 24.

In order to heighten the light transmission of the organic insulating pattern 70, the step of hardening the organic insulating pattern 70 may be additionally made.

As shown in FIGS. 36, 37 and 38, an ITO or IZO-based layer is deposited onto the substrate 10 with the organic insulating pattern 70, and patterned through photolithography to thereby form pixel electrodes 82 contacting the drain electrodes 66 and the storage capacitor conductive pattern 68 through the first and fourth contact holes 72 and 78, and subsidiary gate and data pads 86 and 84 contacting the gate and data pads 24 and 64 through the second and third contact holes 76 and 74.

The subsequent processing steps are then made to thereby complete a thin film transistor array substrate.

As described above, in the thin film transistor array substrate according to the seventh preferred embodiment, the spacers are made during the photolithography process for forming the contact holes at the organic insulating layer without requiring separate processing steps, and this simplifies the relevant processing steps.

Figure 48:
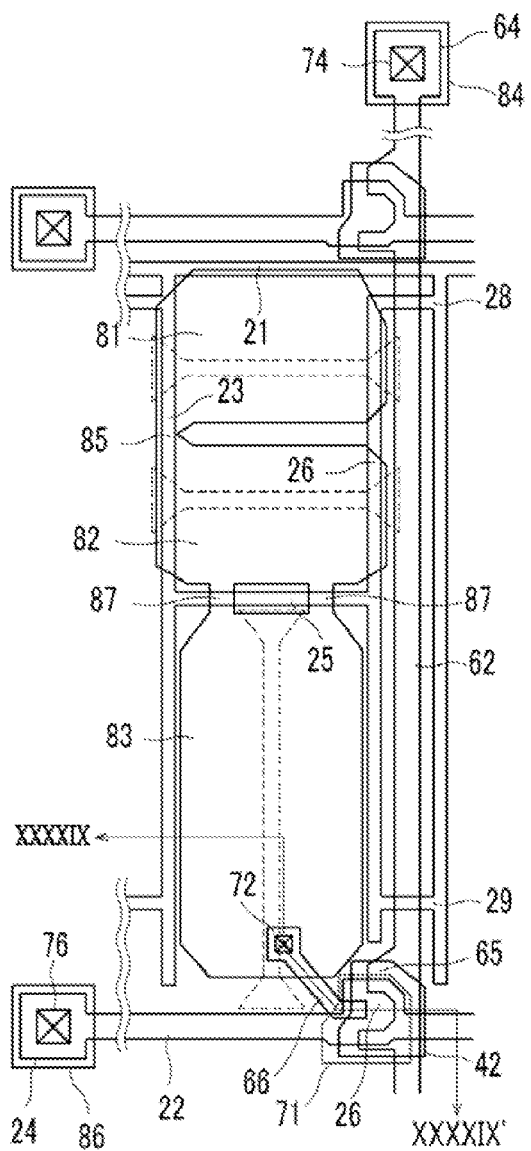
FIG. 48 is a plan view of a thin film transistor array substrate for a liquid crystal display according to an eighth preferred embodiment of the present invention.
Figure 49:
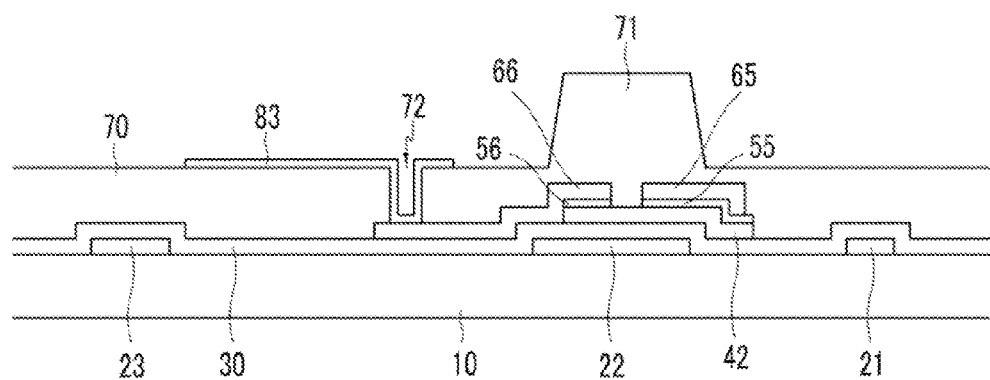
FIG. 49 is a cross sectional view of the thin film transistor array substrate taken along the XXXXIX-XXXXIX' line of FIG. 48.

FIG. 48 is a plan view of a thin film transistor array substrate according to an eighth preferred embodiment of the present invention, and FIG. 49 is a cross sectional view of the thin film transistor array substrate taken along the XXXXIX-XXXXIX' line of FIG. 48.

The basic structure of the thin film transistor array substrate according to the eighth preferred embodiment is the same as that related to the fifth preferred embodiment except for the pattern shape of the protective layer 70. In the fifth preferred embodiment, the spacers are formed at the color filter substrate. However, in this preferred embodiment, the spacers 71 are formed at the thin film transistor array substrate together with the protective layer 70.

As shown in FIG. 49, the protective layer 70 based on an organic insulating material has spacers 71 protruded from the thin film transistors by the height of 4.5-5.5 µm, first contact holes 72 partially exposing the drain electrodes 66, second contact holes 74 exposing the data pads 64, and third contact holes 76 exposing the gate pads 24 together with the gate insulating layer 30. Except for the above components, the protective layer 70 is evenly formed on the entire surface of the substrate 10 by the height of 2-3 µm.

Pixel electrodes each with patterned electrode portions 81, 82, 83, 85 and 87, and subsidiary gate and data pads 86 and 84 are formed on the protective layer 70. The pixel electrodes contact the drain electrodes 66 through the first contact holes 72, and the subsidiary gate and data pads 86 and 84 contact the gate and data pads 24 and 64 through the second and third contact holes 74 and 76.

The above-structured thin film transistor array substrate is combined with the color filter substrate where a common electrode (not shown) with an opening pattern (indicated by the dotted line in FIG. 48) to thereby form a liquid crystal display. In such a liquid crystal display, the pixel electrode pattern and the opening pattern of the common electrode partition the liquid crystal so that a plurality of liquid crystal domains are formed at one pixel region, realizing wide viewing angle.

The method for fabricating the thin film transistor array substrate is the same as that related to the fifth preferred embodiment except for the process of forming the protective layer 70.

The process of forming the protective layer 70 with the spacers 71 and the contact holes 72, 74 and 76 is the same as that related to the sixth and seventh preferred embodiments.

As described above, since the spacers are formed during the process of patterning the organic insulating layer to form contact holes, the processing steps of forming the spacers such as the steps of coating a photoresist film, light-exposing the photoresist film and developing the photoresist film can be omitted, and this significantly reduces the number of relevant processing steps.

As the spacers are fixed to the substrates, the picture quality is enhanced while minimizing variation in the brightness. Furthermore, as the spacers are formed together with the organic insulating pattern, the processing steps can be simplified.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A liquid crystal display comprising:
   a first insulating substrate;
   a first signal line formed on the first insulating substrate;
   a second signal line formed on the first insulating substrate and crossing the first signal line;
   a pixel electrode formed on the first insulating substrate;
   a drain electrode electrically connected to the pixel electrode through a contact hole;
   a spacer formed on the first signal line of the first insulating substrate; and
   a second insulating substrate;
   wherein the spacer is wider at a first portion close to the first insulating substrate than at a second portion close to the second insulating substrate, and
   wherein the drain electrode comprises a first portion and a second portion extending in a different direction with respect to the first portion.

2. The liquid crystal display of claim 1, further comprising a storage capacitor conductive pattern formed on the first insulating substrate, the storage capacitor conductive pattern partially overlapping with the pixel electrode and extending parallel to the first signal line and crossing the second signal line.

3. The liquid crystal display of claim 2, wherein the storage capacitor conductive pattern comprises a first portion parallel to the second signal line and a second portion overlapping with the second signal line and connected to the first portion of the storage capacitor conductive pattern.

4. The liquid crystal display of claim 1, wherein the first portion of the drain electrode extends in a direction parallel to the first signal line.

5. The liquid crystal display of claim 1, wherein the contact hole is positioned adjacently at a center line of the pixel electrode parallel to the second signal line.

6. The liquid crystal display of claim 1, further comprising a semiconductor pattern formed under at least one of the first and second signal lines.

7. The liquid crystal display of claim 6, wherein the spacer partially overlaps with the semiconductor pattern.

8. The liquid crystal display of claim 1, wherein the spacer partially overlaps wit the drain electrode.

9. The liquid crystal display of claim 1, further comprising a passivation layer having the contact hole and covering the first signal line, the second signal line and the drain electrode.

10. The liquid crystal display of claim 9, wherein the spacer and the passivation layer are made of the same material.

11. The liquid crystal display of claim 1, further comprising a plurality of domain dividers formed on at least one of the first insulating substrate and the second insulating substrate.

12. The liquid crystal display of claim 11, wherein the plurality of domain dividers comprise a first domain divider and a second domain divider substantially orthogonal to the first domain divider.

13. The liquid crystal display of claim 11 wherein at least one of the first and the second domain dividers comprises an end portion extending adjacently along an edge of the pixel electrode.

14. The liquid crystal display of claim 11, further comprising a storage capacitor conductive pattern partially overlapping with the pixel electrode and extending parallel to the first signal line and crossing the second signal line, wherein the storage capacitor conductive pattern comprises a first portion parallel to at least one of the first and the second domain dividers.

15. The liquid crystal display of claim 11, wherein the pixel electrode comprises a plurality of openings as the plurality of domain dividers, wherein the plurality of openings comprise a first opening to meet with an edge of the pixel electrode and a second opening surrounded by the pixel electrode.

16. The liquid crystal display of claim 11, wherein the plurality of domain dividers comprises a plurality of openings formed on the first insulating substrate and a plurality of protrusions formed on the second insulating substrate.

17. The liquid crystal display of claim 11, wherein at least one of the first and the second domain dividers comprises an end portion extending adjacently along an edge of the pixel electrode.

* * * * *